United States Patent
Liu et al.

(10) Patent No.: US 12,365,584 B2
(45) Date of Patent: Jul. 22, 2025

(54) METHODS AND APPARATUS FOR ELECTRONIC DEVICE PACKAGING

(71) Applicant: Texas Instruments Incorporated, Dallas, TX (US)

(72) Inventors: Jane Liu, Plano, TX (US); Richard Chen, Taoyuan (TW); William R. Morrison, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 215 days.

(21) Appl. No.: 17/892,895

(22) Filed: Aug. 22, 2022

(65) Prior Publication Data

US 2023/0126914 A1    Apr. 27, 2023

Related U.S. Application Data

(60) Provisional application No. 63/271,762, filed on Oct. 26, 2021.

(51) Int. Cl.
   *B81B 7/00*  (2006.01)
   *B81C 1/00*  (2006.01)

(52) U.S. Cl.
   CPC ........ *B81C 1/00325* (2013.01); *B81B 7/0054* (2013.01); *B81B 2207/09* (2013.01); *B81B 2207/115* (2013.01); *B81C 2201/0167* (2013.01); *B81C 2201/019* (2013.01); *B81C 2203/01* (2013.01); *B81C 2203/032* (2013.01)

(58) Field of Classification Search
   None
   See application file for complete search history.

(56) References Cited

U.S. PATENT DOCUMENTS

| | | | |
|---|---|---|---|
| 2009/0079097 A1* | 3/2009 | Williams | H01L 24/85 257/787 |
| 2010/0075465 A1* | 3/2010 | Chew | H01L 21/56 257/E21.502 |
| 2017/0197823 A1* | 7/2017 | Wachtler | B81B 7/0048 |
| 2019/0106321 A1* | 4/2019 | Vaupel | H01L 23/24 |
| 2019/0144270 A1* | 5/2019 | Liu | B81C 1/00317 359/513 |
| 2022/0189836 A1* | 6/2022 | Morrison | H01L 23/3185 |
| 2024/0228265 A1* | 7/2024 | Liu | B81B 7/0054 |

* cited by examiner

*Primary Examiner* — Benjamin P Sandvik

(74) *Attorney, Agent, or Firm* — Michelle F. Murray; Frank D. Cimino

(57) ABSTRACT

An example method of producing a microelectromechanical system (MEMS) package, the method comprising: applying first epoxy layers to a first substrate, at least one of the first epoxy layers coupled to a second substrate; applying a first post gel heat treatment to the first epoxy layers; after applying the first post gel heat treatment to the first epoxy layers, applying second epoxy layers to the second substrate and to the first epoxy layers; and applying a second post gel heat treatment to the first epoxy layers and the second epoxy layers.

20 Claims, 15 Drawing Sheets

METHODS AND APPARATUS FOR ELECTRONIC DEVICE PACKAGING

CROSS-REFERENCE TO RELATED APPLICATION

This patent application claims the benefit of and priority to U.S. Provisional Patent Application Ser. No. 63/271,762 filed Oct. 26, 2021, which Application is hereby incorporated herein by reference in its entirety.

TECHNICAL FIELD

This description relates generally to packaging, and more particularly to methods and for electronic device packaging.

BACKGROUND

Micro-electromechanical system (MEMS) devices are electronic devices which include mechanical components. For example, a digital micromirror device (DMD) is a MEMS device that uses circuitry to modify a state of a micro-mirror, such that the micro-mirror modulates light outside of a package or towards a heat sink. As MEMS devices become increasingly advanced, methods and apparatuses of manufacturing are becoming increasingly difficult as package sizes of individual MEMS devices decrease. MEMS device packages that include fragile materials, such as a glass panel on a DMD, struggle to meet reliability specifications due to high stress conditions.

SUMMARY

For methods and apparatus to reduce microelectromechanical system package stress, an example method of producing a microelectromechanical system (MEMS) package, the method comprising: applying first epoxy layers to a first substrate, at least one of the first epoxy layers coupled to a second substrate; applying a first post gel heat treatment to the first epoxy layers; after applying the first post gel heat treatment to the first epoxy layers, applying second epoxy layers to the second substrate and to the first epoxy layers; and applying a second post gel heat treatment to the first epoxy layers and the second epoxy layers.

BRIEF DESCRIPTION OF THE DRAWINGS

The same reference numbers or other reference designators are used in the drawings to designate the same or similar (functionally and/or structurally) features.

DETAILED DESCRIPTION

Figure 1A:
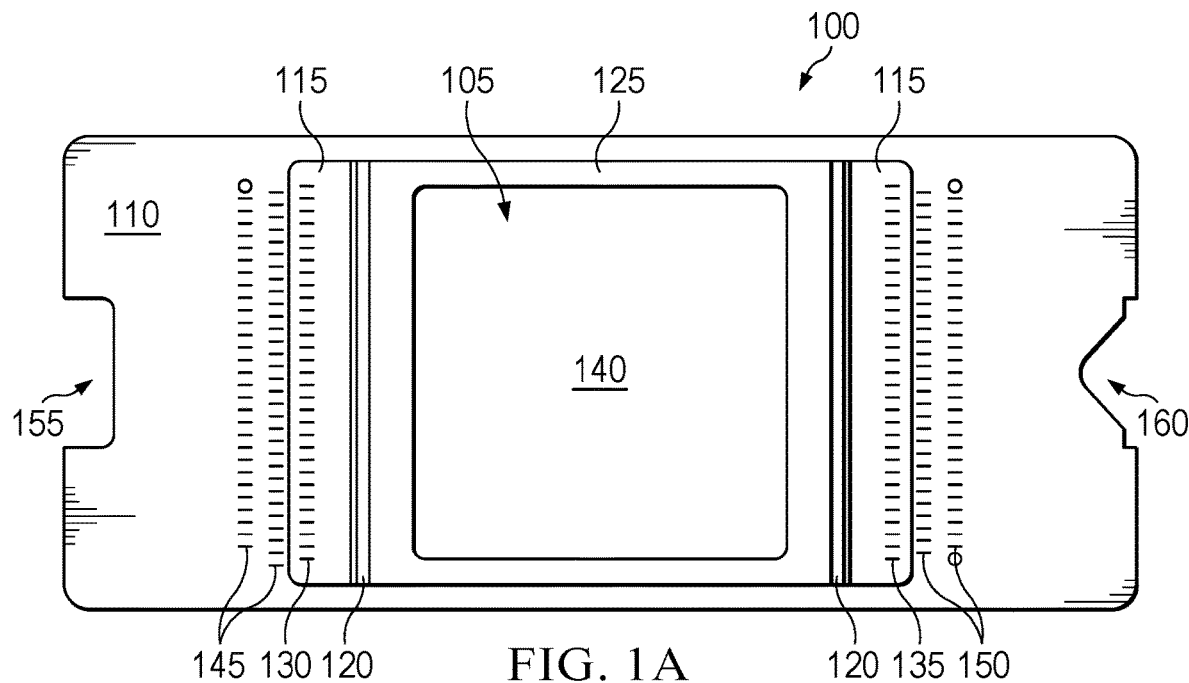
FIGS. 1A-1E are illustrative examples of an example MEMS package including an example MEMS device and an example printed circuit board (PCB) that are electrically coupled using example wire bonds configured to be enclosed by epoxy that forms a two peak epoxy profile.

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Micro-electromechanical system (MEMS) devices are electronic devices which include mechanical components. A MEMS device may be any electronic device capable of converting an electrical signal into a mechanical motion or vice versa. For example, a digital micromirror device (DMD) is a MEMS device that uses circuitry to modify a state of a micro-mirror. In such an example, the micromirror modulates light outside of a package or towards a heat sink based on a mechanical motion of the micro-mirror. Other examples of MEMS devices include radio frequency MEMS (RFMEMS) devices, stacked MEMS devices, optical image sensors, contact image sensor (CIS) panels, etc. MEMS devices often include complex packaging which may include mechanically coupling fragile materials (e.g., a glass panel) to surfaces capable of applying access stress to the MEMS device. Typically, MEMS devices are electrically and/or mechanically coupled to a printed circuit board (PCB) or a ceramic substrate. The PCB may include circuitry to configure the MEMS device using electrical signals. In the example of the DMD, the PCB may include circuitry to configure the position of each of a plurality of micro-mirrors included in the DMD to modulate light supplied by a light source. MEMS device packages may include a semiconductor layer which may be electrically coupled to the PCB or ceramic substrate using a plurality wire bonds using a method of wire bonding.

Wire bonding is a method of semiconductor manufacturing which uses a wire bond to electrically couple a semiconductor to a PCB. In some applications, such as wire bonding a DMD to a PCB, a plurality of wire bonds may be placed to couple a plurality of terminals on the semiconductor layer of a MEMS package to a plurality of terminals on a PCB. Wire bonds, placed during manufacturing, may be uncoated electrical wires. Wire bonds may be manufactured using a conductive material (e.g., copper, gold, aluminum, etc.). Manufactures may coat the wire bonds following their placement to protect and secure wire bonds in a fixed location. Manufactures may use an epoxy or substitute non-conductive material to coat the wire bonds. Typically, the epoxy used to coat wire bonds may be referred to as a free flow epoxy or a glob top epoxy. A free flow epoxy is epoxy with a relatively high viscosity, when first placed by a manufacturer, allowing the epoxy to fill in gaps and molds prior to hardening, such hardening may be referred to as curing the epoxy which causes the epoxy to form a solid material. A glob top epoxy is an epoxy with a relatively low viscosity, when first placed by a manufacturer, which limits changes in shape of glob top epoxy, prior to curing. Epoxy may be dispensed in a viscous state and hardened using a post placement process, such as the epoxy being exposed to air, ultra-violet light, heat, etc.

Manufacturers of MEMS devices may use epoxy to protect wire bonds from damage and prevent electrical shorts between wire bonds. As MEMS devices become increasingly advanced, methods of manufacturing using epoxy coatings are becoming increasingly difficult as package sizes of individual MEMS devices decrease, and reliability standards increase. For example, each MEMS device manufactured for use in automotive applications is required to survive mechanical testing (e.g., AEC-Q100 reliability standards) which simulates rigid automotive environments (e.g., bumpy roads). Such mechanical testing often result in excessive stress being applied to MEMS devices. In applications where MEMS device packages include fragile materials, such as a glass panel on a DMD, may fail to meet increasing reliability specifications due to epoxy coatings applying excessive stress on the MEMS device packaging. Some devices which use glob top epoxy coating to protect wire bonds are failing to meet increasingly high reliability specifications as a result of the cured epoxy applying stress on fragile MEMS device packaging. In some applications, the epoxy coating may cause the MEMS device package to delaminate, crack, lift wire bond pads, etc.

Examples described herein include methods and apparatus to reduce micro-electromechanical system (MEMS) package stress applied by an epoxy coating. In some described examples, an example method of placing glob top epoxy to enclose wire bonds is illustrated to reduce stress applied on a MEMS device package. Glob top epoxy may be dispensed to generate a predetermined shape, such a predetermined shape may be referred to as an epoxy profile. A MEMS device manufacturer may decrease stress placed on a MEMS device package as a result of dispensing epoxy to generate a two peak epoxy profile including two stress reducing peaks. The epoxy profile described herein reduces stress on a MEMS device package as a result of placing a plurality of layers of epoxy between different surfaces of the MEMS device and a PCB. The PCB may be modified to decrease the amount of epoxy used to modify package stress and enclose wire bonds.

The epoxy profile described herein includes constructing a two peak epoxy profile by dispensing, by an epoxy dispenser, a plurality of layers of a glob top epoxy and two post placement processes. In some described examples, a first plurality of layers of epoxy are dispensed to couple a plurality of surfaces of the MEMS device package and form a base on the PCB prior to a first post placement process. The first plurality of layers form a first peak of the two peak epoxy profile. After the first post placement process, a second plurality of layers of epoxy are dispensed to couple the first plurality of layers to a base of the PCB, such that the plurality of epoxy lines mechanically couple the MEMS device to the PCB and enclose bond wires. The second plurality of layers form a second peak of the two peak epoxy profile. Advantageously, the first plurality of layers of epoxy direct stress towards a surface of the MEMS device package capable of handling stress. Advantageously, the plurality of layers of epoxy distribute stress, applied to a fragile surface of the MEMS device packaging, over an increased area to decrease the magnitude of stress which may be applied on a portion of the MEMS device during reliability testing.

FIGS. 1A-1E are illustrative examples a process of assembling an example MEMS package 100. The MEMS package 100 includes an example MEMS device 105 and an example printed circuit board (PCB) 110. The MEMS device 105 is a digital micro-mirror device (DMD). The MEMS device 105 is configured to project an image in response to being configured by the PCB 110 and being illuminated by light. For example, the PCB 110 may supply a voltage to the MEMS device 105 to set the state of a plurality of mirrors of the MEMS device 105, to reflect portions of light from an illumination source (not illustrated) corresponding to the image to be projected. Although FIGS. 1A-1E illustrate the example process with a DMD, the process may be implemented to manufacture other MEMS devices, such as RFMEMS devices, stacked MEMS devices, optical image sensors, in CIS panel processing, etc.

Figure 1B:
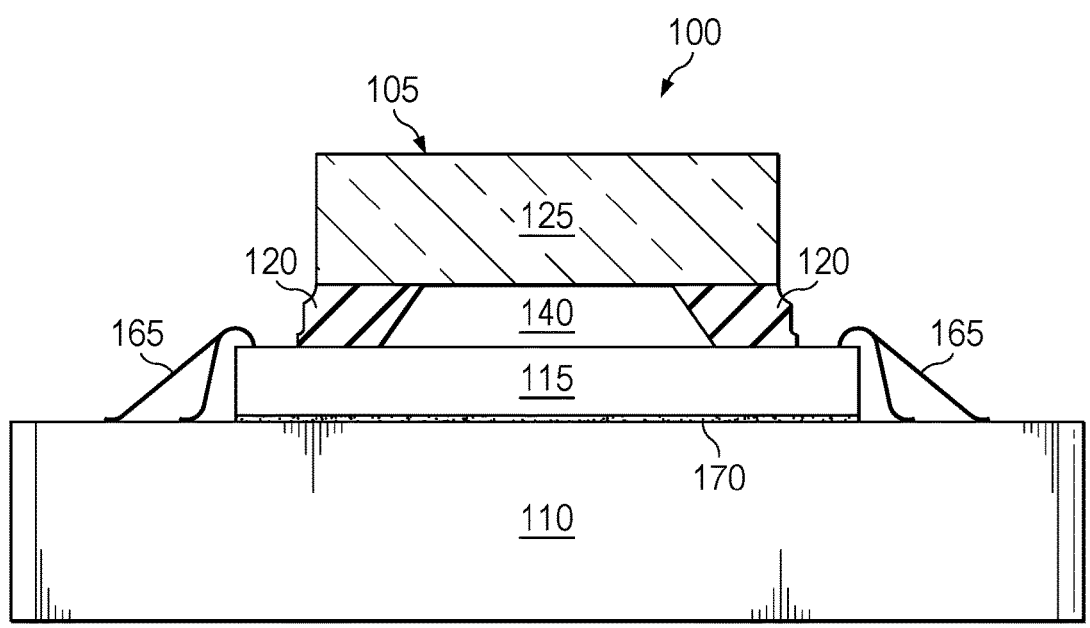

FIG. 1A is illustrates the MEMS device 105 and the PCB 110 prior to being electrically coupled as illustrated in FIG. 1B. In the example of FIG. 1A, the MEMS device 105 includes an example silicon substrate 115, an example spacer 120, and an example glass panel 125. The silicon substrate 115 is mechanically coupled to the PCB 110 and the spacer 120. The silicon substrate 115 includes a first example plurality of terminals 130 and a second example plurality of terminals 135. The silicon substrate 115 may include circuitry (not illustrated), internal electrical traces (not illustrated), and/or mounted mechanical devices (not illustrated) to support operations of the MEMS device 105. For example, the silicon substrate 115 includes electrical traces to couple the plurality of terminals 130 and 135 to internal circuitry to control micro-mirrors housed by the spacer 120. The plurality of terminals 130 and 135 allow the MEMS device 105 to be electrically coupled to additional components, such as the PCB 110. The silicon substrate 115 is manufactured from a silicon material. Alternatively, the silicon substrate 115 may be manufactured using another semiconductor material, such as compound semiconductor materials (e.g., gallium arsenide, gallium nitride, silicon carbide, etc.).

The spacer 120 is coupled between the silicon substrate 115 and the glass panel 125. The spacer 120 encloses an example opening 140. In the example of FIG. 1A, the opening 140 is illustrated as seen through the glass panel 125. The spacer 120 encloses the opening 140 between the silicon substrate 115 and the glass panel 125. The spacer 120 may be modified based on the opening 140, such as including sharp exterior edges (illustrated as lines in FIG. 1A, and as contours in FIG. 1B) to provide structural support and/or direct stress away from components housed in the opening 140. The opening 140, surrounded by the spacer 120, houses a plurality of micro-mirrors (not illustrated). The opening 140 is configured to be large enough to allow the plurality of micro-mirrors to move. The spacer 120 may constructed based on an area needed for the plurality of micro-mirrors to move during operations of the MEMS device 105. For example, the plurality of micro-mirrors may be configured to transition between a first position, which reflects light towards a projection surface (not illustrated) to project an image, and a second position, which reflects light towards a heat sink to prevent a portion of the projection surface from being illuminated. In such an example, the first position and the second position correspond to different angles in which the plurality of micro-mirrors are positioned, such transitions between positions corresponds to a mechanical motion. Alternatively, the spacer 120 may be configured, in accordance with the teachings disclosed herein, to enclose an alternate mechanical component configured for a mechanical motion.

In the example of FIG. 1A, the glass panel 125 is mechanically coupled to the silicon substrate 115 and the spacer 120. The glass panel 125 allows light to enter the MEMS device 105, prior to be reflected, and leave the MEMS device 105, after being reflected. Excessive stress on the glass panel 125 results in the glass panel 125 cracking and/or delaminating during reliability testing. Detection of such damages to the glass panel 125 are typically determined during an optical inspection following reliability testing. Damage to the glass panel 125 results in manufacturers discarding damaged MEMS devices.

The PCB 110 is coupled to MEMS device 105. The PCB 110 includes a third example plurality of terminals 145, a fourth example plurality of terminals 150, a first example cut 155, and a second example cut 160. The PCB 110 may include circuitry (not illustrated), internal electrical traces (not illustrated), etc. The PCB 110 supplies and/or receives electrical inputs by the plurality of terminals 145 and 150. The plurality of terminals 145 and 150 are configured to be electrically coupled to an external component, such as the MEMS device 105. The cuts 155 and 160 assists in mounting the MEMS package 100 to an external device. For example, a difference in shape between the cuts 155 and 160 indicates an orientation of the MEMS package 100. The PCB 110 may be a ceramic substrate. In applications where the PCB 110 is a ceramic substrate, the ceramic substrate may be manufactured using an alumina oxide ceramic, an alumina nitride ceramic, a high temperature co-fired ceramic, a low temperature co-fired ceramic etc.

In the example of FIG. 1B, the MEMS package 100 is illustrated following the application of example wire bonds 165. In the example of FIG. 1B, the MEMS package 100 includes the MEMS device 105, the PCB 110, the wire bonds 165, and an example adhesive 170. The wire bonds 165 are configured to electrically couple the plurality of terminals 130 and 135 of FIG. 1A to the plurality of terminals 145 and 150 of FIG. 1A, respectively. In the example of FIG. 1B, the wire bonds 165 are uncoated electrical conductors, such as wire made of copper, gold, aluminum, etc.

In the example of FIG. 1B, the PCB 110 is coupled to the silicon substrate 115 by the adhesive 170. The adhesive 170 is a non-conducting adhesive. The adhesive 170 is applied before the wire bonds 165. The adhesive 170 assists in placing the wire bonds 165 by securing the MEMS device 105 to the PCB 110 during the placement of the wire bonds 165.

Figure 1C:
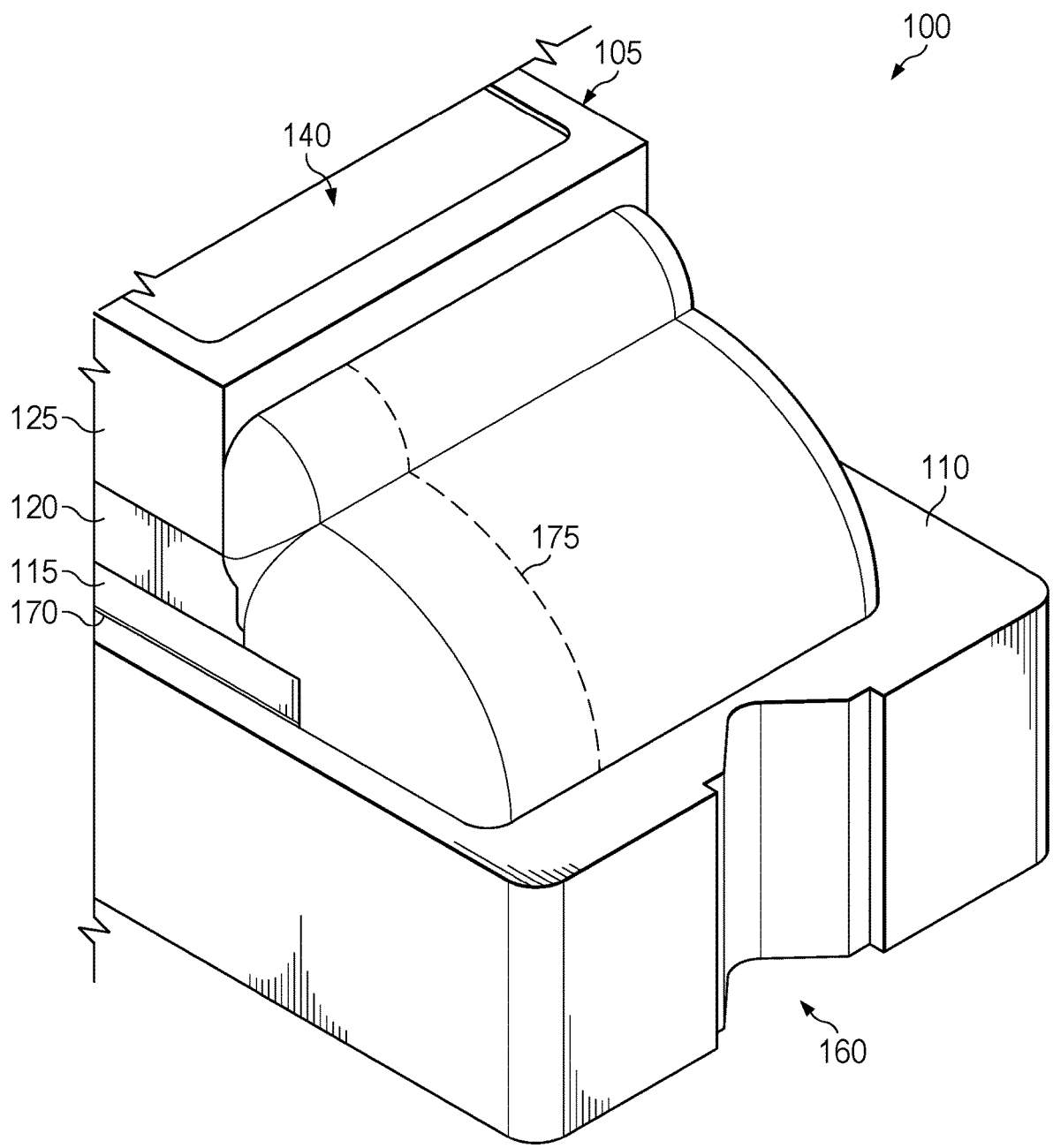

FIG. 1C illustrates the MEMS package 100 following an application of epoxy to form an example two peak epoxy profile 175. In the example of FIG. 1C, the two peak epoxy profile 175 encloses the wire bonds 165 of FIG. 1B. The MEMS device 105 is mechanically coupled to the PCB 110 by the two peak epoxy profile 175 including a first peak 180 and a second peak 185. The two peak epoxy profile 175 is formed by applying, using an epoxy dispenser (not illustrated), a plurality of layers of a glob top epoxy. For example, each peak comprising such a two peak epoxy profile 175 may be a result of applying one or more layers of epoxy that are cured throughout the application process. Such an application of epoxy is described in connection with FIGS. 2 and 9, below. Advantageously, the two peak epoxy profile 175 prevents damage and/or shorting of the wire bonds 165. The two peak epoxy profile 175 increases the reliability of the electrical connection between the MEMS device 105 and the PCB 110.

Figure 1D:
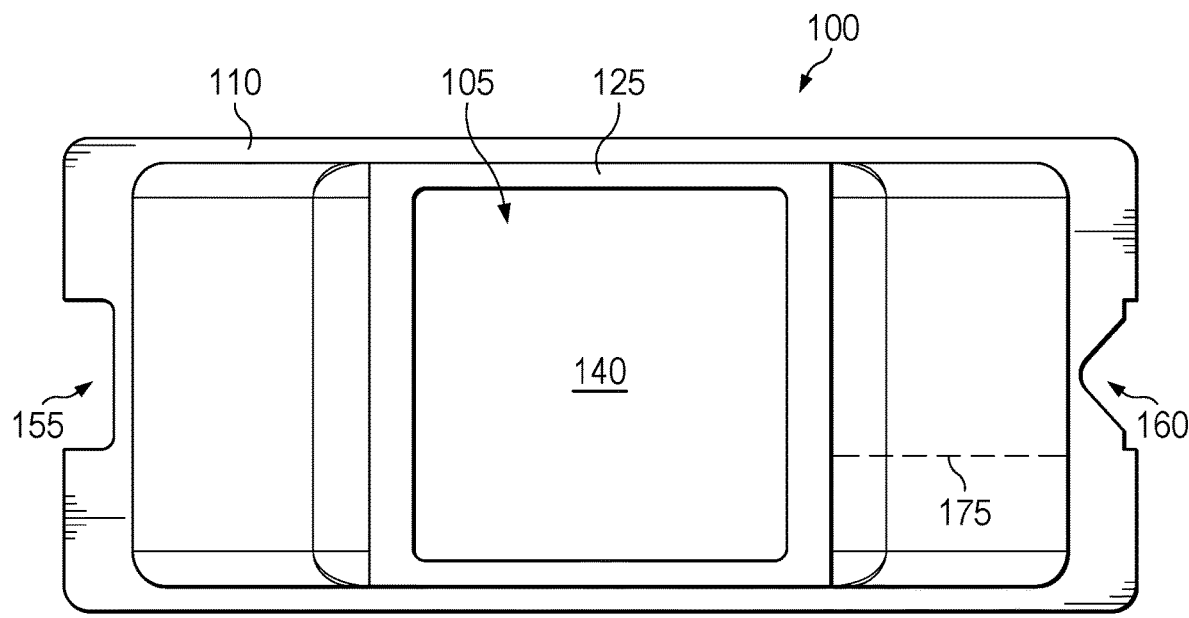

FIG. 1D is a top view of the MEMS package 100 following the application of epoxy to construct the two peak epoxy profile 175.

Figure 1E:
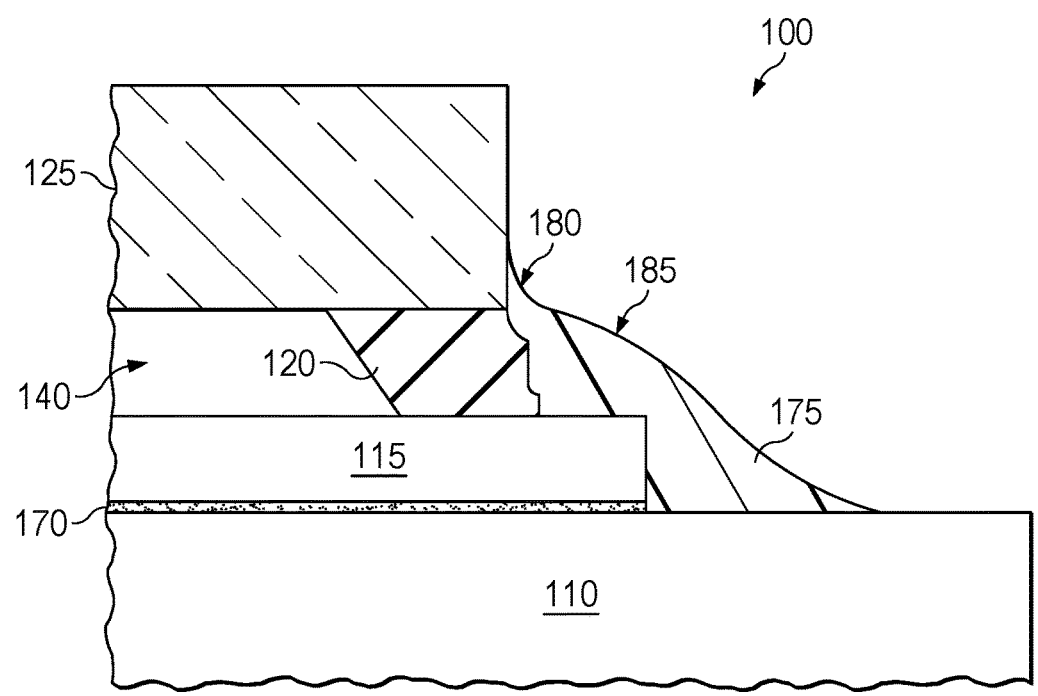

FIG. 1E is a center cut view of the MEMS package 100 following the application of epoxy to construct the two peak epoxy profile 175.

FIGS. 2A-2E are illustrative examples of steps for an application of the two peak epoxy profile 175 of FIG. 1C configured to reduce stress on the MEMS device 105 of FIG. 1. In the examples of FIGS. 2A-2E, the two peak epoxy profile 175 includes a first plurality of layers 200, illustrated in FIGS. 2A and 2B, and a second plurality of layers 205, illustrated in FIGS. 2C and 2D. The first plurality of layers 200 includes a first layer 220, a second layer 225, a third layer 230, and a fourth layer 235. The second plurality of layers 205 includes a fifth layer 240, a sixth layer 245, and a seventh layer 250. The plurality of layers 200 and 205 each construct a peak of the two peak epoxy profile. The peaks corresponding to the plurality of layers 200 and 205 are configured prevent excessive stress from being applied to the MEMS device 105. Alternatively, the plurality of layers 200 and 205 may be modified in accordance with the teachings disclosed herein to prevent excessive stress from being applied to similar portions of MEMS devices. The MEMS device 105 is coupled to the PCB 110 of FIG. 1A-1E by the adhesive 170. The adhesive 170 may be fully or partially cured prior to the application of epoxy illustrated in FIGS. 2A-2E. The adhesive 170 holds the MEMS device 105 in place while the wire bonds 165 and the layers 220-250 are applied.

The plurality of layers 200 and 205 are separated by a first post placement process which converts epoxy comprising the first plurality of layers 200 from a viscous state to at least a partially hardened state (cured). The first post placement process ensures that a shape of the first plurality of layers 200 is unchanged as the second plurality of layers 205 are being applied. For example, the first post placement process includes placing the MEMS package 100 with the first plurality of layers 200 in a one-hundred and ten degrees Celsius heater for approximately seven minutes to at least partially cure the layers 220-235. Following an application of the second plurality of layers 205 a second post placement process may occur to at least partially cure the layers 240-250 prior to an extended curing process. For example, the second post placement process may include using a heater to apply one-hundred and ten degrees Celsius for approximately ten minutes to ensure a shape of the layers 240-250 remain the same during a twelve hour curing process.

Figure 2A:
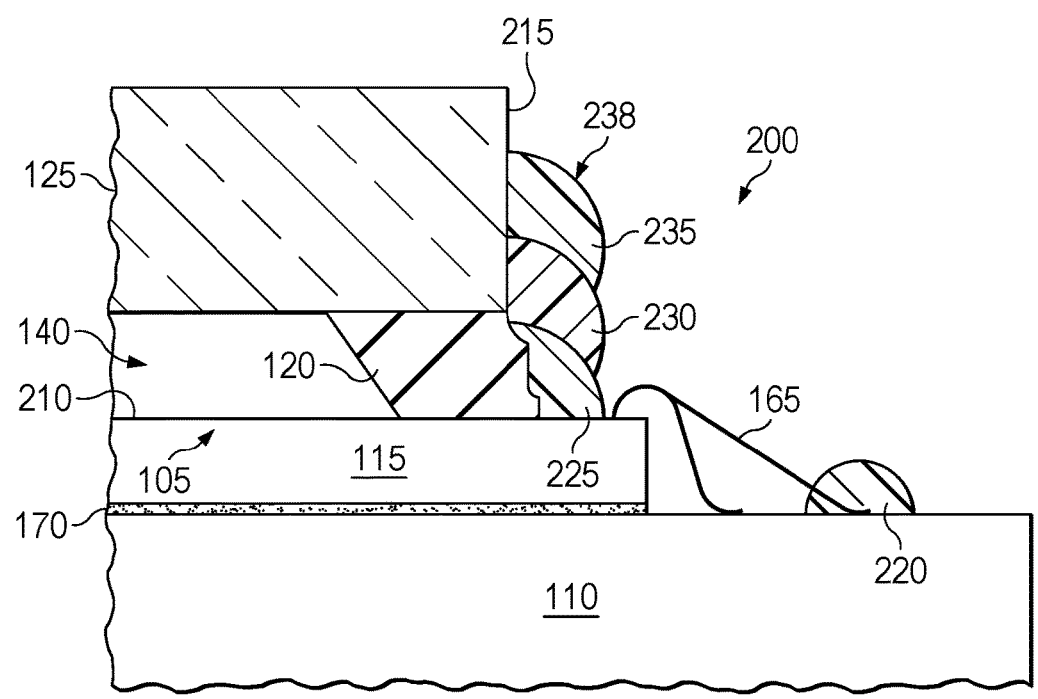
FIGS. 2A-2E are illustrative examples of an application of epoxy to construct the two peak epoxy profile of FIG. 1 to reduce stress on the MEMS device of FIG. 1.
Figure 2B:
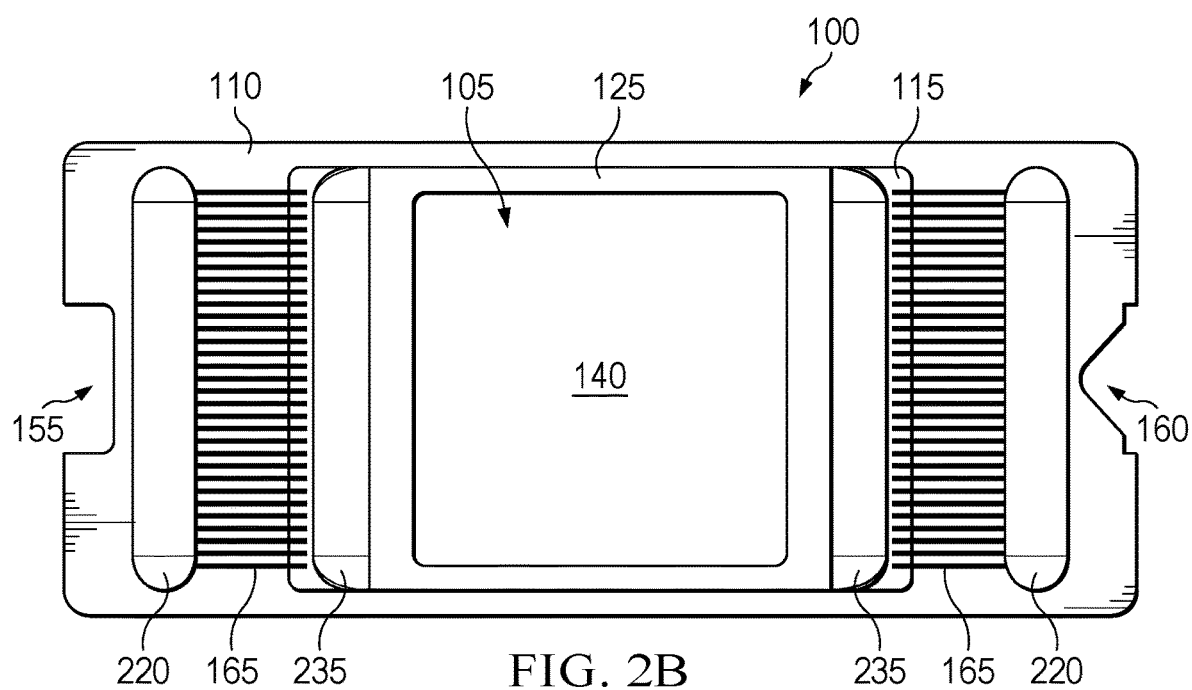

FIGS. 2A and 2B illustrate the first plurality of layers 200. A portion of the first plurality of layers 200, including the second layer 225, and the third layer 230 mechanically couple a first surface 210 of the MEMS device 105 to a second surface 215 of the MEMS device 105. The first surface 210 is atop surface of the silicon substrate 115. The second surface 215 includes a side wall of the spacer 120 and a side wall of the glass panel 125. The layers 220-235 are layers of epoxy that are individually placed using an epoxy dispenser (not illustrated). The epoxy comprising the layers 220-235 is a glob top epoxy. The glob top epoxy comprising the layers 220-235 approximately holds the same shape as the epoxy is dispensed. Applying the layers 225-235 of the first plurality of layers 200 forms an example first peak 238 as a result of the glob top epoxy holding approximately the same shape as when the epoxy is being dispensed. The first peak 238 adjacent to the second surface 215.

The first layer 220 of epoxy, encloses portions of the wire bonds 165 that are in contact with the PCB 110, such that the wire bonds 165 are mechanically coupled to the PCB 110. For example, the first peak 238 encloses a portion of the wire bonds 165 that is the farthest from the second surface 215. Alternatively, additional epoxy or another layer of epoxy may be applied to the PCB 110 to enclose additional portions of the PCB 110 and/or the wire bonds 165. The first layer 220 is a barrier to prevent epoxy overflow and ensure the two peak epoxy profile 175 is maintained. The first layer 220 is placed as a part of the first plurality of layers 200 to prevent the second plurality of layers 205 from overflowing and/or deforming the two peak epoxy profile 175. The first layer 220 is at least partially cured prior to the application of the second plurality of layers 205 to prevent the application of the layers 240-250 from damaging the wire bonds 165. The second layer 225 mechanically couples the first surface 210 to the second surface 215, such that the glass panel 125 and/or the spacer 120 is mechanically coupled to the silicon substrate 115. The third layer 230 mechanically couples the second layer 225 to the second surface 215, such that the third layer 230 is stacked on top of the second layer 225. The fourth layer 235 of epoxy mechanically couples the third layer 230 to the second surface 215, such that the fourth layer 235 is stacked on top of the third layer 230. Advantageously, the layers 225-235 are stacked on top of each other to increase an area of the second surface 215 that is mechanically coupled adjacent to the epoxy comprising the layers 225-235, such that stress applied to the first plurality of layers 200 is distributed across the surfaces 210 and 215.

Figure 2C:
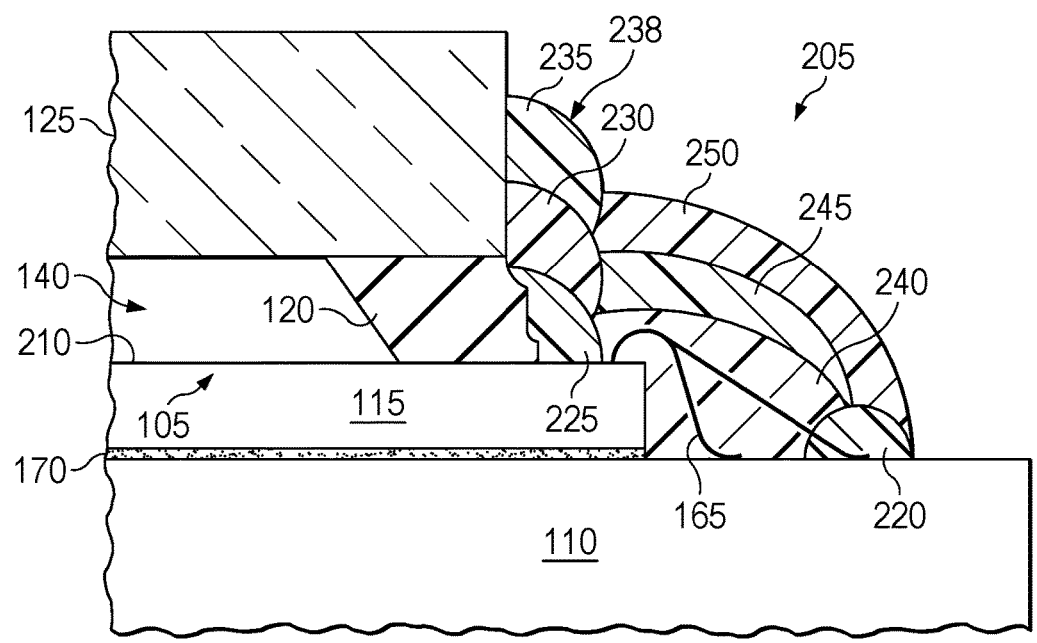
Figure 2D:
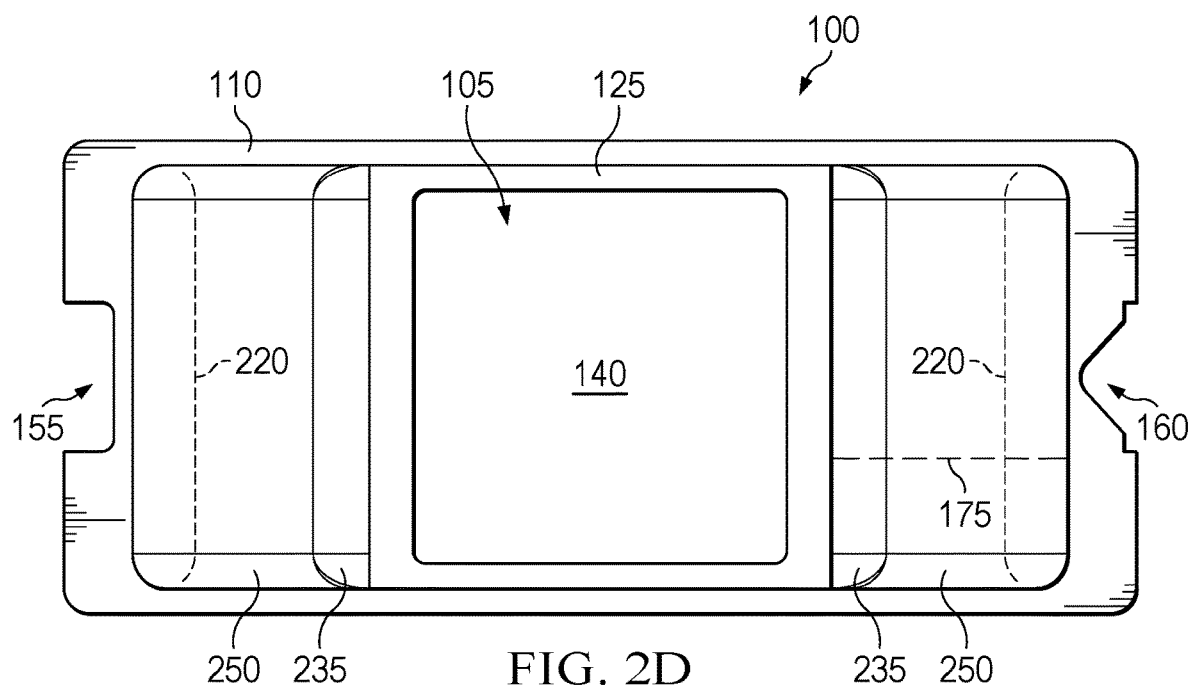
Figure 2E:
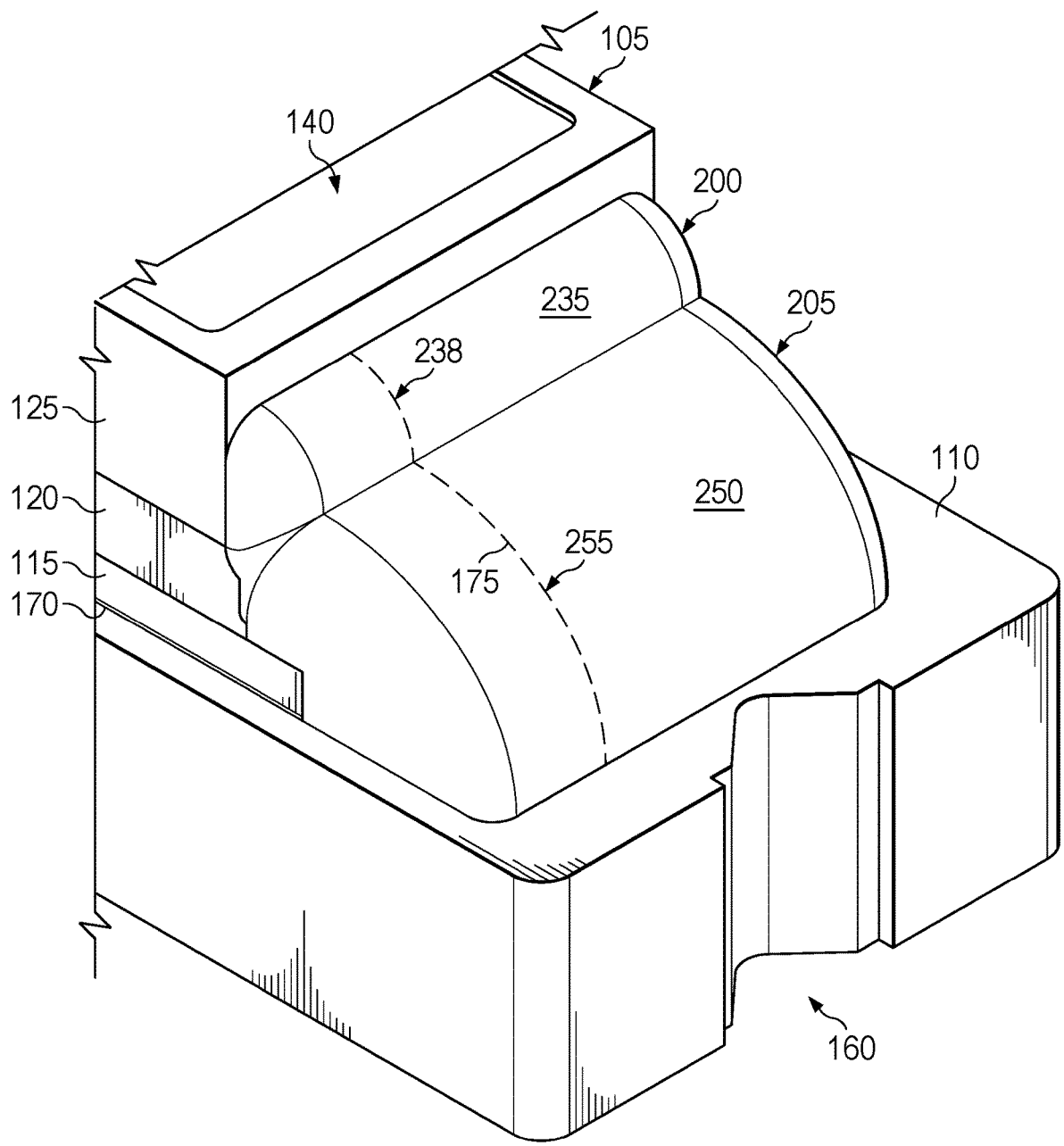

The second plurality of layers 205, illustrated in FIGS. 2C and 2D, is mechanically coupled to the PCB 110, the wire bonds 165, the silicon substrate 115, and the first plurality of layers 200. The second plurality of layers 205 enclose the wire bonds 165. The second plurality of layers 205 prevent the wire bonds 165 from shorting and increases durability. The layers 240-250 are layers of epoxy that may be individually placed using an epoxy dispenser. The epoxy comprising the layers 240-250 is a glob top epoxy. The glob top epoxy comprising the layers 240-250 holds approximately the same shape as when the epoxy is being dispensed. Applying the layers 220 of the first plurality of layers 200 and the layers 240-250 of the second plurality of layers 205 forms an example second peak 255, illustrated in FIGS. 2C-2E.

The fifth layer 240 of epoxy is mechanically coupled to the silicon substrate 115, the PCB 110, the wire bonds 165, and the first plurality of layers 200. The fifth layer 240 mechanically couples the MEMS device 105 and the PCB 110. The fifth layer 240 encloses at least a portion of the wire bonds 165. The fifth layer 240 mechanically couples the first plurality of layers 200 to the PCB 110, such that the second layer 225 is mechanically coupled to the PCB 110 and the first layer 220. The sixth layer 245 of epoxy mechanically couples the first plurality of layers 200 to the PCB 110 and the fifth layer 240, such that the sixth layer 245 is stacked on top of the fifth layer 240, touching first layer 220 and at least a portion of the layers 225-235. The seventh layer 250 of epoxy is mechanically coupled to the first plurality of layers 200, the PCB 110, and the sixth layer 245, such that the seventh layer 250 is stacked on top of the sixth layer 245. The seventh layer 250 touches the first layer 220 and at least a portion of layers 225-235. The seventh layer 250 leaves a portion of the first layer 220 exposed to ensure the two peak epoxy profile 175 holds shape and prevent the seventh layer 250 from overflowing past the first layer 220. Advantageously, the second plurality of layers 205 is mechanically coupled to the PCB 110 and the first plurality of layers 200, such that stress applied to the second plurality of layers 205 is distributed across the surface area of the first plurality of layers 200.

In the examples of FIGS. 2A-2E, the plurality of layers 200 and 205 construct an epoxy profile with the peaks 238 and 255. The stacking of the layers 225-235 form the first peak 238 and the stacking of layers 220 and 240-250 form the second peak 255. The two peak epoxy profile 175, generated by the plurality of layers 200 and 205, may differ as a result of modifying an amount of epoxy dispensed (discussed in connection with FIGS. 3A-3C, below), modifying the PCB 110 (discussed in connection with FIGS. 4A-6B, below), a thickness of the silicon substrate 115 of the MEMS device 105 (discussed in connection with FIGS. 5 and 7A-7C, below), etc.

The peaks 238 and 255 are configured to reduce stress applied to fragile portions of the MEMS device 105, such as the glass panel 125. The first peak 238 directs stress, applied to the first plurality of layers 200, towards the silicon substrate 115. For example, the layers 225-235 may be stacked to construct an arch with the first peak 238 being approximately in contact with the glass panel 125 and a base in contact with the silicon substrate 115. In such an example, stress applied to the layers 225-235 is directed, by the arch, towards the silicon substrate 115. The second peak 255 directs stress, applied to the second plurality of layers 205 towards the first layer 220 and the PCB 110. For example, the layers 240-250 may be stacked to construct an arch with the second peak 255 being approximately in contact with the first plurality of layers 200 and a base in contact with the PCB 110 and/or the first layer 220. In such an example, stress applied to the layers 240-250 is directed, by the arch, towards the PCB 110 and/or the first layer 220. Advantageously, the two peak epoxy profile 175 reduces stress applied to the glass panel 125 by directing stress towards portions of the MEMS package 100 capable of handling increased stress.

Figure 3A:
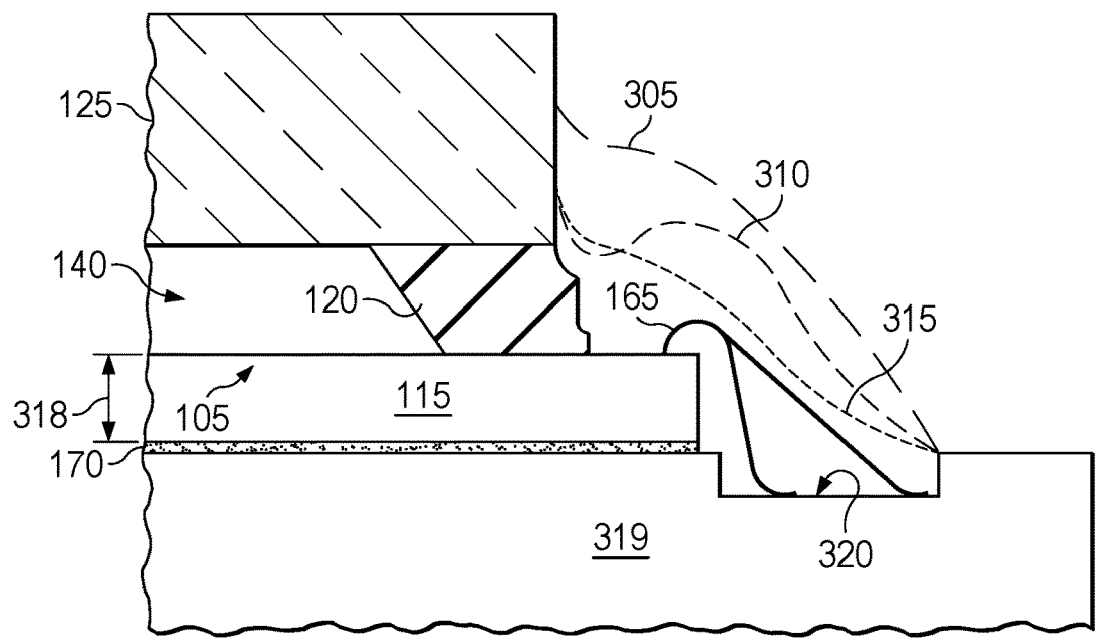
FIGS. 3A-3C illustrate a first example epoxy profile, a second example epoxy profile, and a third example epoxy profile which are illustrative examples of the two peak epoxy profile of FIGS. 1A-1C and 2A-2C constructed using the application of epoxy illustrated in FIGS. 2A-2C and configured to encapsulate wire bonds between the MEMS device of FIGS. 1A-1C and 2A-2C and an example PCB.
Figure 3B:
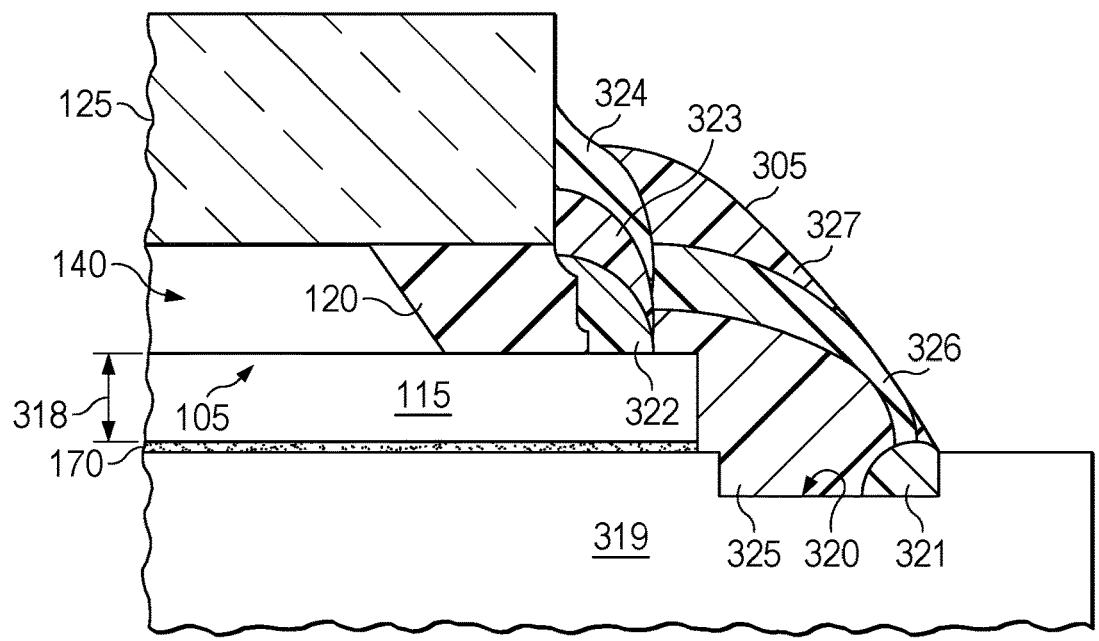
Figure 3C:
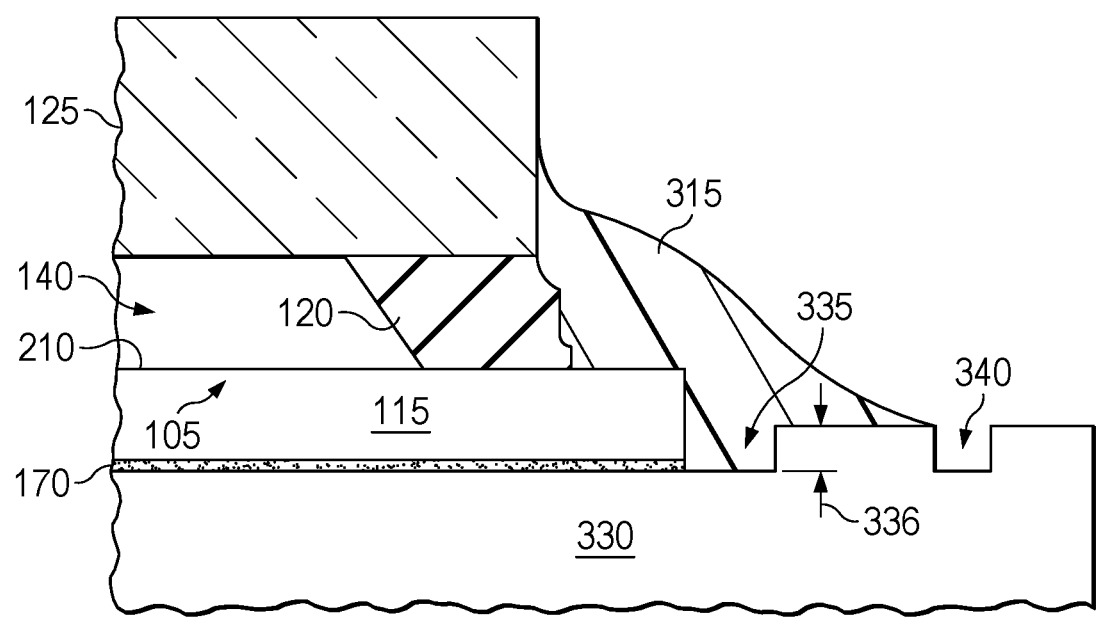

FIGS. 3A-3C illustrate a first example of epoxy profile 305, a second example epoxy profile 310, and a third example epoxy profile 315 which may be constructed using the application of epoxy illustrated in FIGS. 2A-2E. In the examples of FIGS. 3A-3C, the epoxy profiles 305-315 are configured similarly to the two peak epoxy profile 175 of FIGS. 1C-1E and 2A-2E. The epoxy profiles 305-315 each include a first peak that corresponds to a portion of the first plurality of layers 200 and a second peak that corresponds to the second plurality of layers 205. The epoxy profiles 305-315 illustrate potential curvature of each of the peaks based on the amount of epoxy comprising each of the layers 220-250 of FIGS. 2A-2E. The epoxy profiles 305-315 are illustrated using the MEMS device 105 of FIGS. 1A-1E and 2A-2E. In the example of FIGS. 3A-3C, the silicon substrate 115 of FIGS. 1A-1E and 2A-2E has a thickness 318 of approximately 500 micro-meters (μm). The thickness 318 of the silicon substrate 115 is a distance between the spacer 120 of FIGS. 1A-1E and 2A-2E and the PCB 319. Modifying the thickness 318 of the silicon substrate 115 modifies the curvature of the epoxy profiles 305-315, such modifications are discussed in connection with FIGS. 5 and 7, below.

The epoxy profiles 305-315 may be modified based on a first example PCB 319. The first PCB 319 includes a first example channel 320, wherein the wire bonds 165 are electrically coupled to the first PCB 319. The first channel 320 may extend across the first PCB 319. The first channel 320 increases control over applying the layers 220-250. For example, the first channel 320 may be used as a guide for applying the first layer 220 and the second plurality of layers 205. In some examples, the first channel 320 may be manufactured to increase the magnitude of stress which may be applied to the PCB 319 in response to increasing the surface area in contact with the epoxy profiles 305-315. The first channel 320 reduces epoxy overflow as a result of the epoxy comprising the layers 220-250 being contained by the first channel 320. Manufacturers may configure an amount of epoxy applied to each layer based on the PCB 319. For example, the first channel 320 requires additional epoxy to be applied during the second plurality of layers 205 to ensure that the wire bonds 165 are completely encapsulated by epoxy. In some examples, the first channel 320 may decrease an area of the first plurality of layers 200 in contact with the second plurality of layers 205 as a result of additional epoxy being used to fill the first channel 320.

In the example of FIG. 3A, the epoxy profiles 305-315 illustrate example two peak epoxy profiles, which may be constructed using different amounts of epoxy when applying the layers 220-250. For example, a first amount of epoxy for each of the layers 220-250 may be used to construct the first epoxy profile 305, a second amount of epoxy for each of the layers 220-250 may be used to construct the second epoxy profile 310, and a third amount of epoxy for each of the layers 220-250 may be used to construct the first epoxy profile 305. In such an example, the first amount is greater than the second amount, which is greater than the third amount. The amount of epoxy dispensed for each of the layers 220-250 may vary to modify curvature of the peaks. For example, a first amount of epoxy may be used for the first plurality of layers 200 and a second amount of epoxy may be used for the second plurality of layers 205 to generate the second epoxy profile 310. In such an example, the second amount of epoxy is greater than the first amount. Advantageously, the epoxy profiles 305-315 may be generated as a result of modifying the amount of epoxy comprising each of the layers 220-250 to generate a two peak epoxy profile.

FIG. 3B illustrates an example application of epoxy to construct the second epoxy profile 310 of FIG. 3A. In the example of FIG. 3B, the second epoxy profile 310 includes a first layer 321, a second layer 322, a third layer 323, a fourth layer 324, a fifth layer 325, a sixth layer 326, and a seventh layer 327. The layers 321-324 are applied similar to the first plurality of layers 200 of FIG. 2A. However, in the example of FIG. 3B, the first layer 321 is placed in the first channel 320. Similar to the first layer 220 of FIG. 2A, the first layer 321 prevents epoxy from overflowing and provides support to ensure the layers 325-327 are placed on at least partially cured epoxy. The layers 322-324 construct a first peak. The layers 325-327 are applied similar to second plurality of layers 205 of FIG. 2C. However, the amount of epoxy comprising the fifth layer 325 is modified to fill the first channel 320. Advantageously, the application of epoxy of FIGS. 2A-2E may be applied to a plurality of PCBs (e.g., the PCB 110, the first PCB 319) with slight modifications to locations of application, such as the first layer 321 in the channel 320, and to amount of epoxy comprising a layer, such as increasing the epoxy comprising the fifth layer 325.

Advantageously, the first epoxy profile 305 reduces a magnitude of stress applied to any portion of the glass panel 125 by being mechanically coupled to as much of the glass panel 125 as possible to disperse the stress across as great of a geometric area as possible. However, the first epoxy profile 305 includes substantially more epoxy than what is needed to encapsulate the wire bonds 165. Such an excess of epoxy increases a cost to manufacture the MEMS device 105. Advantageously, an amount of epoxy comprising the second epoxy profile 310 is substantially decreased compared to that of the first epoxy profile 305. However, curvature of peaks comprising the second epoxy profile 310 are much greater than the first epoxy profile 305. Such curvature results in stress being directed towards the first plurality of layers 200, which are not as capable of handling stress as the PCB 319. The second epoxy profile 310 may result in an increase in occurrences of delamination, glass cracks, and/or wire lifting during reliability testing as a result of applying additional stress to the first plurality of layers 200. Advantageously, an amount of epoxy comprising the third epoxy profile 315 is reduced compared to that of the epoxy profiles 305 and 310. Advantageously, the third epoxy profile 315 includes peaks configured to apply stress towards the silicon substrate 115 and/or the PCB 319. However, such a reduction in epoxy of the third epoxy profile 315 decreases durability of the wire bonds 165.

In the example of FIG. 3C, the epoxy profiles 305-315 may be modified based on a second example PCB 330. The second PCB 330 includes a second example channel 335 and a third channel 340. The second channel 335 is configured to house the MEMS device 105. The second channel 335 has an example depth 336. The second channel 335 modifies the length of wire bonds between the MEMS device 105 by decreasing a distance between the second PCB 330 and the first surface 210 of FIG. 2A. The depth 336 may be modified to further decrease the distance between the second PCB 330 and the first surface 210. The amount of epoxy required to encapsulate the wire bonds 165 is decreased as a result of decreasing the distance between the first surface 210 and the second PCB 330. Advantageously, the second PCB 330 decreases the amount of epoxy required to encapsulate wire bonds between the MEMS device 105 and the second PCB 330 as a result of the second channel 335 housing the MEMS device 105, such as to decrease the length of the wire bonds. The depth of the second channel 335 is less than or approximately equal to the thickness of the silicon substrate 115. The third channel 340 is a stress relief cut. The third channel 340 reduces an amount of stress that may be applied to the third epoxy profile 315 of FIG. 3C by directing stress towards portions of the second PCB 330. Such a stress relief cut increases manufacturing complexity.

The epoxy profiles 305-315 are illustrative examples of a two peak epoxy profile configured to reduce stress on the side of the glass panel 125. The epoxy profiles 305-315 may be modified as a result of the amount of epoxy dispensed for each of the layers 220-250 and/or the PCB being coupled to the MEMS device 105 (e.g., the PCBs 110, 319, and 330). Advantageously, the amount of epoxy comprising the two peak epoxy profiles may be reduced as a result of modifying the PCB.

Figure 4:
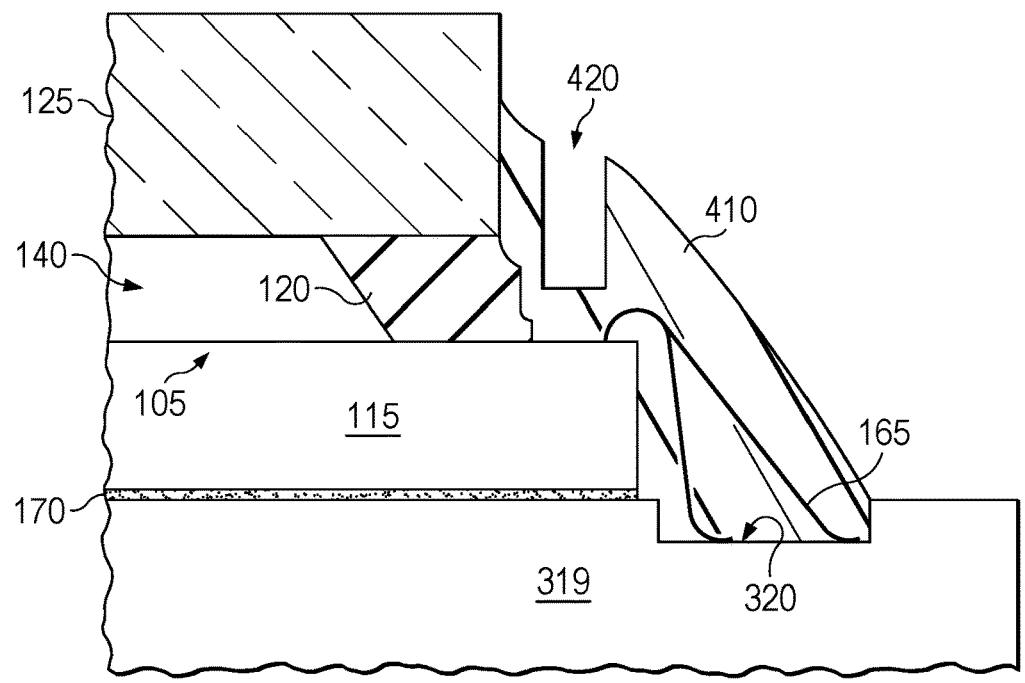
FIG. 4 is an illustrative example of the epoxy profiles of FIGS. 3A-3C configured to encapsulate wire bonds between the MEMS device of FIGS. 1A-1C and 2A-2C and the PCB of FIGS. 3A and 3B.

FIG. 4 is an illustrative example of implementing the two peak epoxy profiles 305-315 of FIGS. 3A-3C to encapsulate wire bonds between the MEMS device 105 of FIGS. 1A-1E, 2A-2E, and 3A-3C and the PCB 319 of FIGS. 3A and 3B. In the example of FIG. 4, wire bonds 165 are configured to electrically couple the MEMS device 105 to the first PCB 319. The wire bonds 165 are encapsulated by the epoxy profile 410. The epoxy profile 410 is constructed by first applying epoxy as to construct the first epoxy profile 305. The first epoxy profile 305 forming a two peak epoxy profile (e.g., the two peak epoxy profile 175 of FIGS. 1C-1E) to reduce stress applied to a side of the glass panel 125. An example channel 420 is cut from the first epoxy profile 305 to create the epoxy profile 410. The channel 420 may extend across the MEMS device 105. Similar to the second channel 335 of FIG. 3C, the channel 420 is a stress relief cut.

The channel 420 further reduces stress applied on the glass panel 125 by preventing stress from being applied to the first plurality of layers 200 by the second plurality of layers 205. The channel 420 is configured to reduce stress applied on the glass panel 125, such that the stress is applied to portions of a package of the MEMS device 105 and/or the PCB 319 where stress may be applied without damaging the MEMS device 105. For example, the channel 420 prevents stress from being applied to the glass panel 125 by directing stress, from the first PCB 319, away from the glass panel 125. In such an example, the channel 420 increases the likelihood that the MEMS device 105 will pass reliability testing without mechanical or electrical failure.

The channel 420 decreases the amount of epoxy encapsulating wire bonds, which may decrease a durability of the wire bonds being encapsulated. For example, the channel 420 increases a chance of wire lifting by directing access stress towards the second plurality of terminals 135 of FIG. 1. The channel 420 increases an integration complexity of the modified epoxy profile 410 as a result of additional processes required to create the channel 420. For example, a manufacturer may add an additional process to cut the channel 420 to convert the first epoxy profile 305 to create the modified epoxy profile 410.

Figure 5:
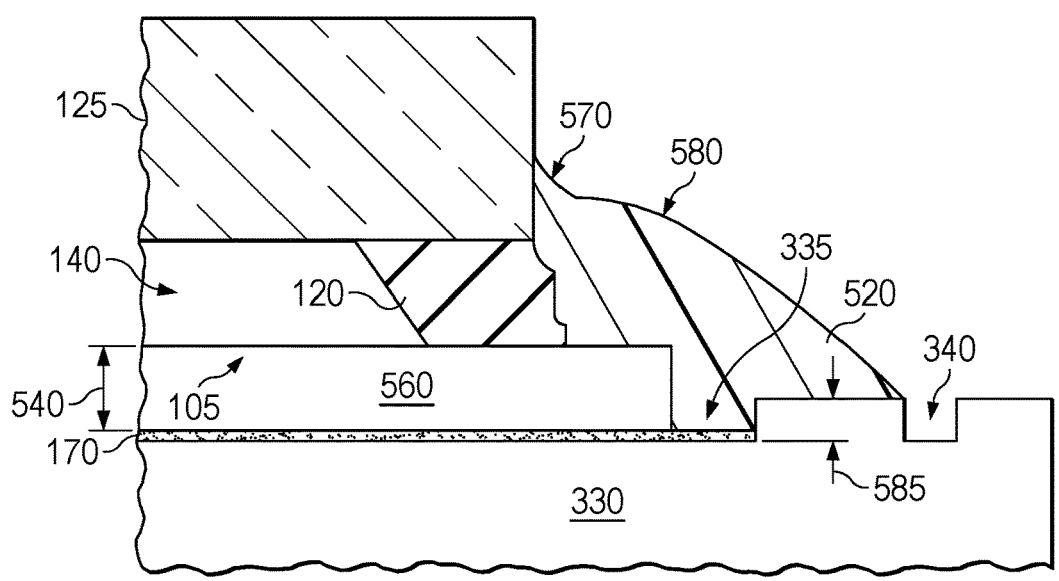
FIG. 5 is an illustrative example an example epoxy profile being modified by a thickness of an example silicon substrate.

FIG. 5 is an illustrative example an example epoxy profile 520 being modified by an example thickness 540 of an example silicon substrate 560. In the example of FIG. 5, the silicon substrate 560 is manufactured from a silicon substrate of the thickness 540. The epoxy profile 520 may be constructed similar to one of the epoxy profiles 305-315 of FIGS. 3A-3C. However, the epoxy profile 520 may be a modified version of the first epoxy profile 305 as a result of the thickness 540 being greater than a thickness of the silicon substrate 115. The epoxy profile 520 is an example two peak epoxy profile (e.g., the epoxy profiles 305-315 of FIGS. 3A-3C) constructed using the plurality of layers 200 and 205 of FIGS. 2A-2C. An example first peak 570 is constructed as a result of the first plurality of layers 200 and an example second peak 580 is constructed as a result of the second plurality of layers 205. Advantageously, the epoxy profile 520 decreases stress applied to the glass panel 125.

The silicon substrate 560 is electrically coupled to the second PCB 330 of FIG. 3C using wire bonds (not illustrated), which are encapsulated by epoxy comprising the epoxy profile 520. The silicon substrate 560 is manufactured to be of the thickness 540. For example, the thickness 540 may be between two-hundred and fifty micro-meters (μm) and seven-hundred and fifty micro-meters (μm). A thickness of a silicon substrate may be increased as a result of the MEMS device 105 requiring additional traces and/or circuitry to support operations of the MEMS device 105. The MEMS device 105 may be modified to replace the silicon substrate 115 with the silicon substrate 560 based on an application of the MEMS device 105. An application of the MEMS device 105 that includes more layers of silicon may be to support additional operations. For example, a first application of the MEMS device 105, modified to include the silicon substrate 115, may support a first resolution and a second application of the MEMS device 105, modified to include the silicon substrate 560, may support a second resolution, such that the second resolution is greater than the first resolution. In such an example, the silicon substrate 560 includes additional traces, doped regions, and/or circuitry. The MEMS device 105 of FIGS. 1A-1E, 2A-2E, 3A-3C, and 4A-4C may be modified to replace the silicon substrate 115 of FIGS. 1A-1E, 2A-2E, 3A-3C, and 4A-4C with the silicon substrate 560 based on an application of the MEMS device 105, such that an application which requires fewer layers of silicon may be used to decrease cost. For example, a first application which requires the MEMS device 105 to include a one-hundred by one-hundred gird of micro-mirrors may require the silicon substrate 115 consisting of a plurality of layers that result in a first thickness of two-hundred and fifty micro-meters (μm). In such an example, a second application which requires the MEMS device 105 to include a one-thousand by one-thousand gird of micro-minors may require the silicon substrate 560 consisting of a plurality of layers that result in the thickness 540 of seven-hundred and fifty micro-meters (μm).

An example channel thickness 585 of the channel 335 may be modified based on the thickness 540. For example, the channel thickness 585 of the channel 335 may be increased to house more of the silicon substrate 560. Modifying the channel thickness 585 of the channel 335 may decrease the length of the wire bonds 165 by reducing the distance between the plurality of terminals being electrically coupled by the wire bonds 165. The epoxy profile 520 needs the channel thickness 585 of the channel 335 to be less than or approximately equal to a thickness of the silicon substrate 560 to ensure the two peak epoxy profile reduces stress applied on the glass panel 125. For example, the channel thickness 585 may be less than or equal to five-hundred micro-meters (μm) when the thickness 540 of the silicon substrate 560 is equal to five-hundred micro-meters (μm).

The epoxy profile 520 is a two peak epoxy profile, such that the epoxy profile 520 constructed using the plurality of layers 200 and 205. The amount of epoxy comprising the layers 220-250 of FIGS. 2A-2E may be modified based on the silicon substrate 560. An amount of epoxy comprising the epoxy profile 520 may be based on the thickness 540 and/or additional characteristics (e.g., the second PCB 330, the second channel 335 of FIG. 3C, length of wire bonds, etc.). For example, a first application including the silicon substrate 115 of a first thickness may require a reduced amount of epoxy in comparison to a second application including the silicon substrate 560 of the thickness 540 when the thickness 540 is greater than the thickness of the silicon substrate 115. In such an example, the amount of epoxy may be reduced by up to thirty-five percent as a result of the first application including wire bonds of a reduced length compared to the second application, such that a decrease in wire bond length decreases an area to be encapsulated. Advantageously, an amount of epoxy required for a two peak epoxy profile may be decreased as a result of a decrease in a thickness of a silicon substrate and/or a reduction in wire bond lengths.

Figure 6A:
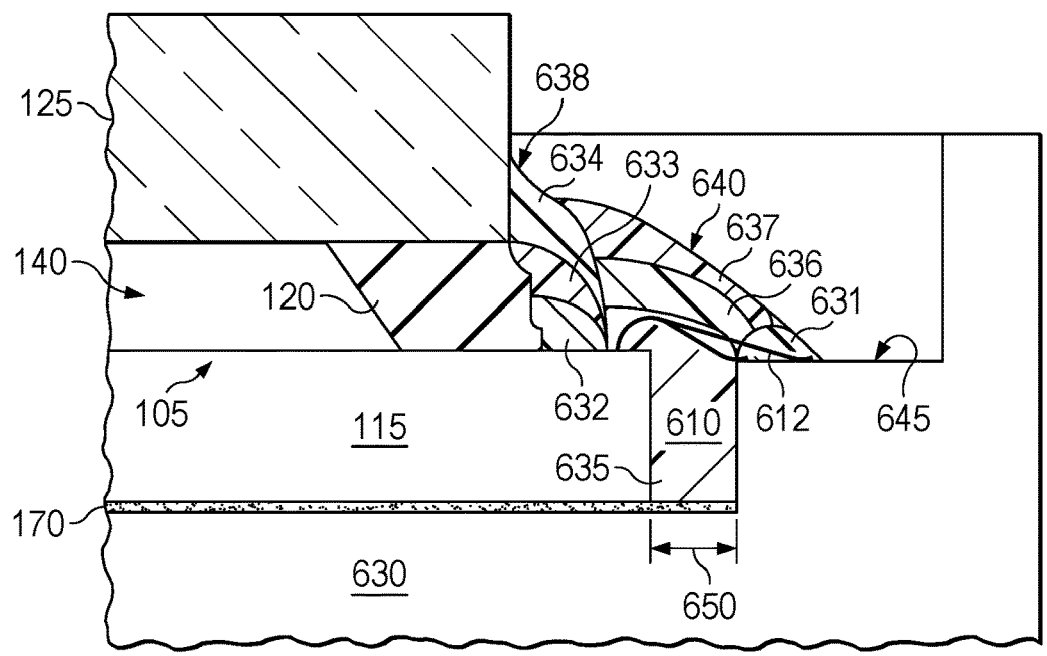
FIGS. 6A and 6B are illustrative examples of MEMS packages including a first example epoxy profile and a second example epoxy profile configured to encapsulate wire bonds that electrically couple the MEMS device of FIGS. 1A-1C, 2A-2C, 3A-3C, and 4A-4C and an example PCB.
Figure 6B:
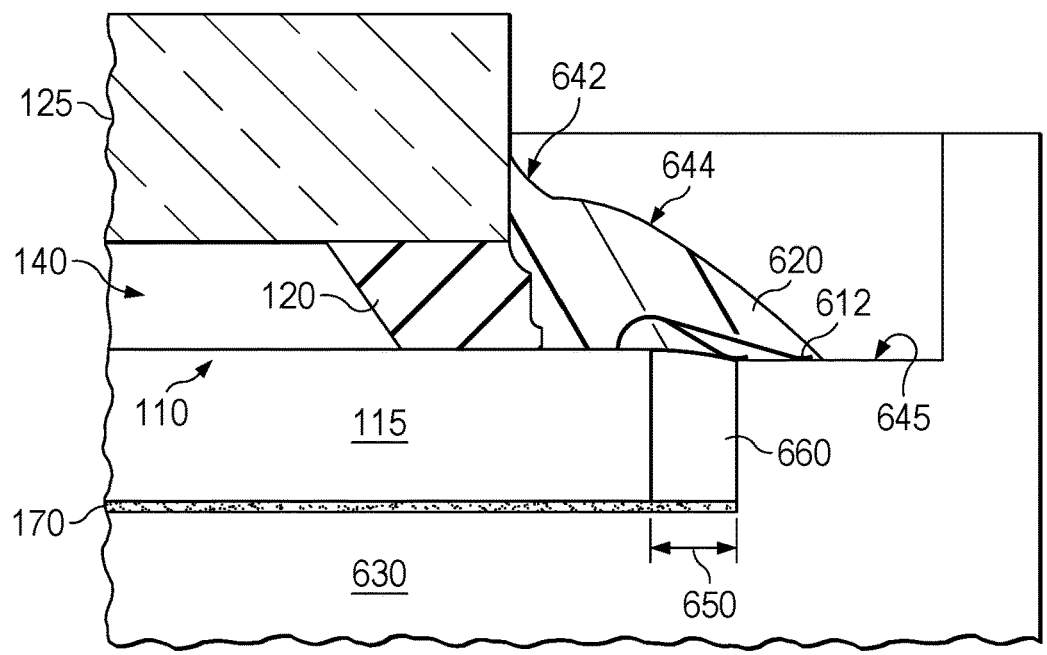

FIGS. 6A and 6B are illustrative examples of MEMS packages including a first example epoxy profile 610 illustrated in FIG. 6A, example wire bonds 612, and a second example epoxy profile 620, illustrated in FIG. 6B, configured to encapsulate wire bonds 612 that electrically couple the MEMS device 105 of FIGS. 1A-1C, 2A-2C, 3A-3C, and 4A-4C to an example PCB 630. In the examples of FIGS. 6A and 6B, the epoxy profiles 610 and 620 are examples of two peak epoxy profiles (e.g., the epoxy profiles 305-315 of FIGS. 3A-3C and the epoxy profile 520 of FIG. 5) including the plurality of layers 200 and 205 of FIGS. 2A-2C. The first epoxy profile 610, illustrated in FIG. 6A, includes a first layer 631, a second layer 632, a third layer 633, a fourth layer 635, a fifth layer 635, a sixth layer 636, and a seventh layer 637. The layers 631-635 are applied in a similar manner to the first plurality of layers 200 of FIG. 2A and the layers 321-324 of FIG. 3B. Similar to the first layer 220 of FIG. 2A and the first layer 321 of FIG. 3B, the first layer 631 prevents epoxy from overflowing and provides support to ensure the layers 635-637 are placed on at least partially cured epoxy. The layers 632-634 construct a first peak 638. The layers 635-637 are applied similar to second plurality of layers 205 of FIG. 2C. The first epoxy profile 610 encloses the wire bonds 612.

The first epoxy profile 610 includes a first peak 638, constructed as a result of the first plurality of layers 632-635, and a second peak 640, constructed as a result of the second plurality of layers 636 and 637. The second epoxy profile 620, illustrated in FIG. 6B, includes a third peak 642, constructed as a result of the first plurality of layers 632-635, and a fourth peak 644, constructed as a result of the second plurality of layers 636 and 637. The PCB 630 includes an example channel 645 configured to house at least a portion of the MEMS device 105, such that at least a portion of the MEMS device 105 is enclosed by the PCB 630.

The epoxy profiles 610 and 620 enclose wire bonds (illustrated in FIG. 6A) that are configured to electrically couple the silicon substrate 115 to the PCB 630. The first epoxy profile 610 is configured to fill an example gap 650 between the silicon substrate 115 and the channel 645 of the PCB 630 with epoxy. For example, the gap 650 may be less than or equal to one-millimeter (mm). The gap 650 is a portion of the channel 645 which wire bonds (not illustrated) pass over. The first epoxy profile 610 mechanically couples the MEMS device 105 to the PCB 630 using epoxy contained within the gap 650. The amount of epoxy used to manufacture the fifth layer 635 differs based on a distance spanned by the gap 650 between the MEMS device 105 and the PCB 630. For example, increasing the depth and/or width of the gap 650 increases the amount of epoxy comprising the fifth layer 635. The gap 650 may be filled with epoxy prior to or as a part of the first plurality of layers 200. For example, a manufacturer may fill in the gap 650 with epoxy prior to applying the layers 220-235 to allow epoxy filling the gap 650 to cure prior to placing the second plurality of layers 205. In such an example, filling the gap 650 with epoxy prior to applying the second plurality of layers 205 may increase the accuracy of the second plurality of layers 205, such that the second plurality of layers 205 may construct the second peak 255 on a fully or partially cured epoxy base. Advantageously, an integration complexity of the first epoxy profile 610 may be reduced as a result of filling the gap 650 with epoxy prior to applying the second plurality of layers 205. Advantageously, accuracy of constructing the peaks 238 and 255, by an application of the plurality of layers 200 and 205, may be increased as a result of filling the gap 650 prior to application of the second plurality of layers 205.

The second epoxy profile 620 is configured to enclose the wire bonds 612 and an example spacer 660, such that wire bonds and the spacer 660 are protected by epoxy comprising the second epoxy profile 620. The gap 650 may be filled using the spacer 660. The spacer 660 is configured to span the gap 650 to reduce the amount of epoxy required to construct the second epoxy profile 620. The spacer 660 may be manufactured using a non-conductive material, such as plastic, insulator, etc. Advantageously, the spacer 660 may be placed prior to constructing the second epoxy profile 620 to reduce the amount of epoxy required to create a two peak epoxy profile. Advantageously, a cost of the second epoxy profile 620 is decreased, compared to the first epoxy profile 610, as a result of decreasing the amount of epoxy.

The PCB 630 is configured to house the MEMS device 105. The PCB 630 is configured to include the channel 645 to allow the glass panel 125 to extrude outside of the PCB 630, such that an optical output (light reflected by micromirrors through the glass panel 125) of the MEMS device 105 may be unobstructed by the PCB 630. Although the channel 645 is illustrated with reference to the PCB 630 in FIGS. 6A and 6B, many other methods of housing the MEMS device 105 may alternatively be used in accordance with this description. For example, the depth and/or shape may be modified. Similarly, additional operations may be included in the manufacturing process before, in between, or after the manufacturing the PCB 630 shown in the illustrated examples.

Figure 7A:
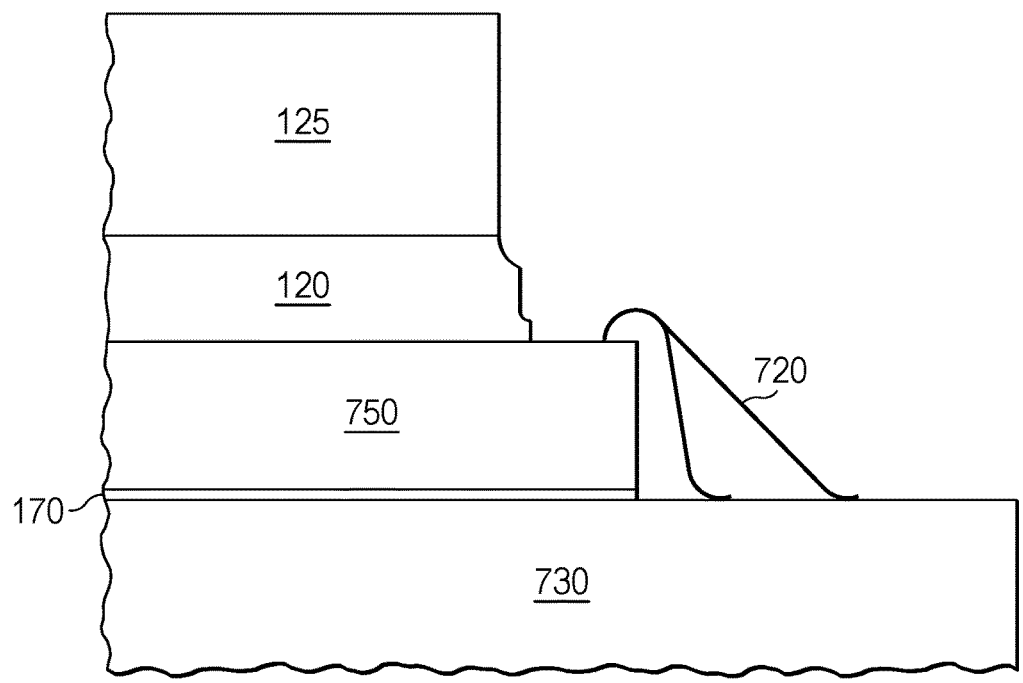
FIGS. 7A-7C are illustrative examples of an example two peak epoxy profile that encloses example wire bonds configured to electrically couple an example PCB and an example MEMS device including a silicon substrate of an example thickness.
Figure 7B:
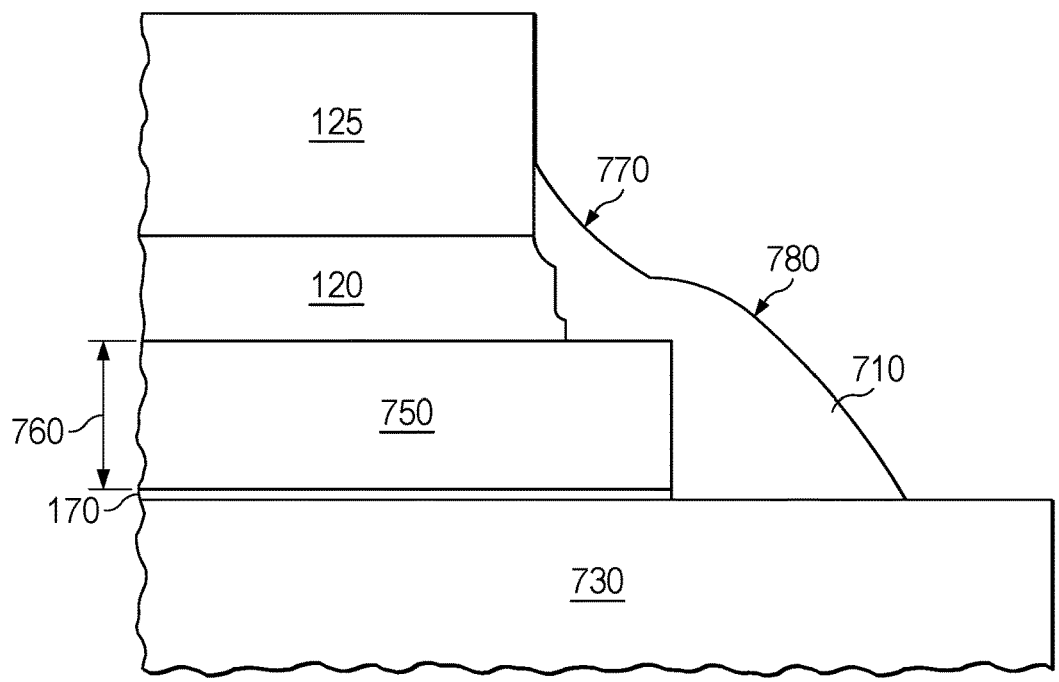
Figure 7C:
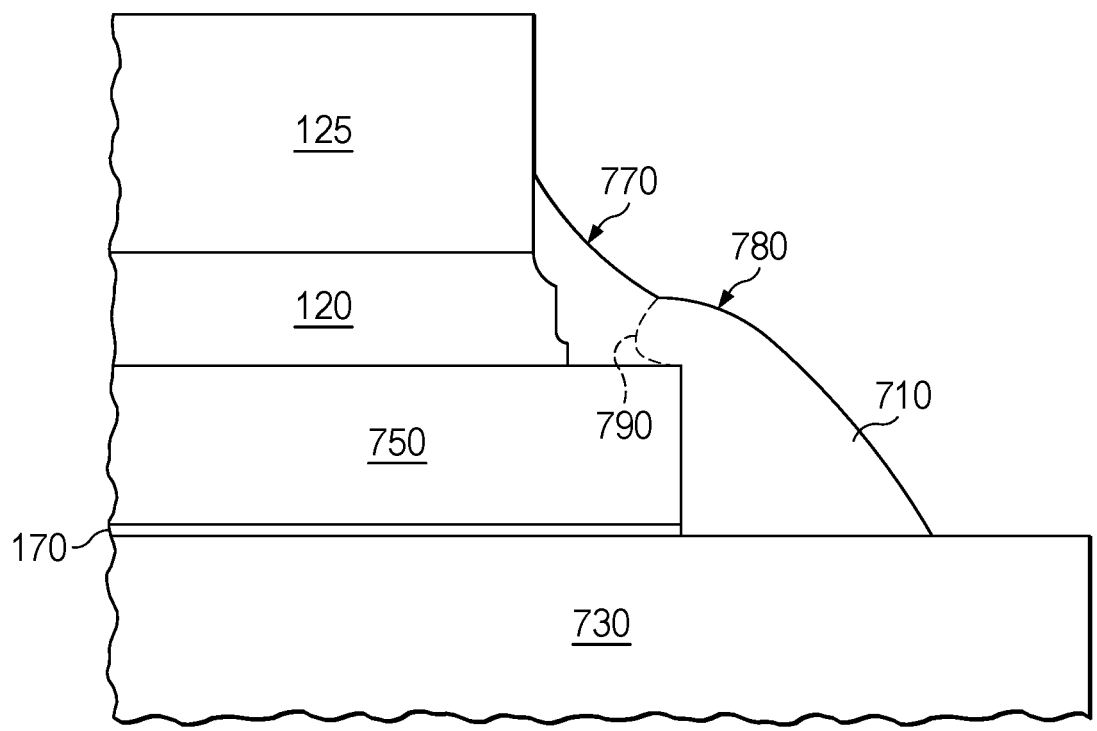

FIGS. 7A-7C are illustrative examples of an example epoxy profile 710 that encloses example wire bonds 720 configured to electrically couple an example PCB 730 and a silicon substrate 750 of an example thickness 760. In the example of FIG. 7A, the wire bonds 720 are illustrated without an epoxy coating. The wire bonds 720 are a plurality of gold wires configured to individually couple each of the plurality of terminals 130 and 135 of FIG. 1A to the plurality of terminals 145 and 150 of FIG. 1A. Alternatively, the wire bonds 720 may be a conductive metal such as copper, aluminum, etc.

In the example of FIG. 7B, the epoxy profile 710 is an example two peak epoxy profile (e.g., the epoxy profiles 305-315 of FIGS. 3A-3C, the epoxy profiles 520 of FIG. 5, and the epoxy profiles 610 and 620 of FIGS. 6A and 6B) including the plurality of layers 200 and 205 of FIGS. 2A-2E, such that a first peak 770 is constructed as a result of the first plurality of layers 200 and a second peak 780 is constructed as a result of the second plurality of layers 205. In the examples of FIGS. 7A-7C, the thickness 760 is approximately equal to 750 micrometers (μm). Alternatively, the thickness 760 may be greater than or less than 750 micrometers. The thickness 760 may be determined based on the complexity of a MEMS devices as described, above, in connection with the MEMS device 105.

The epoxy profile 710 includes the first peak 770 and the second peak 780. The peaks 770 and 780 are formed based on an amount of epoxy applied, the thickness 760, and the PCB 730. In the example of FIG. 7C, an example layer interconnection 790 is illustrated. The layer interconnection 790 is a concave arch representative of an interconnection of the plurality of layers 200 and 205, which construct the epoxy profile 710. The layer interconnection 790 is an illustrative representation of which portions of the first plurality of layers that stress is applied by epoxy comprising the second plurality of layers 205. Additionally, the layer interconnection 790 illustrates an area of the silicon substrate 750 wherein stress is applied by the second plurality of layers 205. The layer interconnection 790 may be modified as a result of modifying the thickness 760 and/or the amount of epoxy applied to construct the epoxy profile 710. For example, increasing the thickness 760 increases the portions of the layer interconnection 790 which corresponds to stress being applied to the silicon substrate 750. In such examples, excessive stress to the silicon substrate 750 may cause wire lifting, such as a separation of wire bonds 720 from the silicon substrate 750.

Figure 8A:
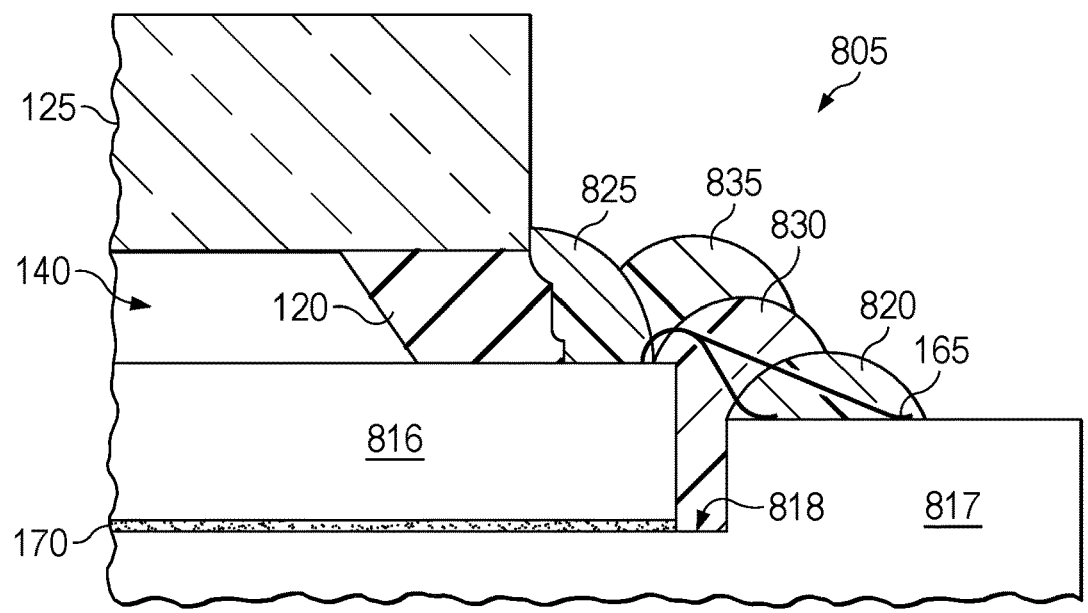
FIGS. 8A-8C are illustrative examples of a first example epoxy profile, a second example epoxy profile, and a third example epoxy profile configured to include a plurality of peaks to manage stress applied to a MEMS device.
Figure 8B:
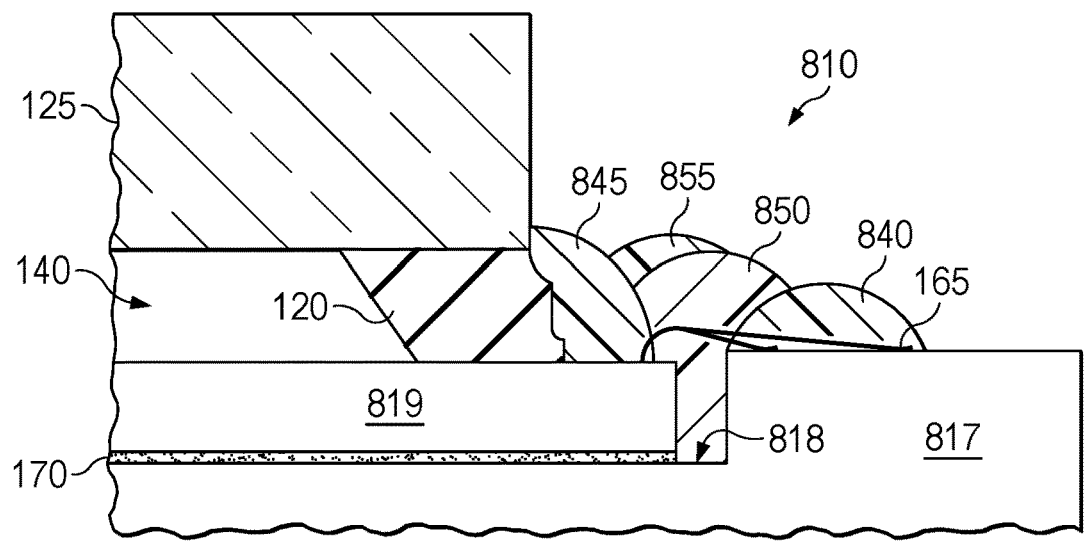
Figure 8C:
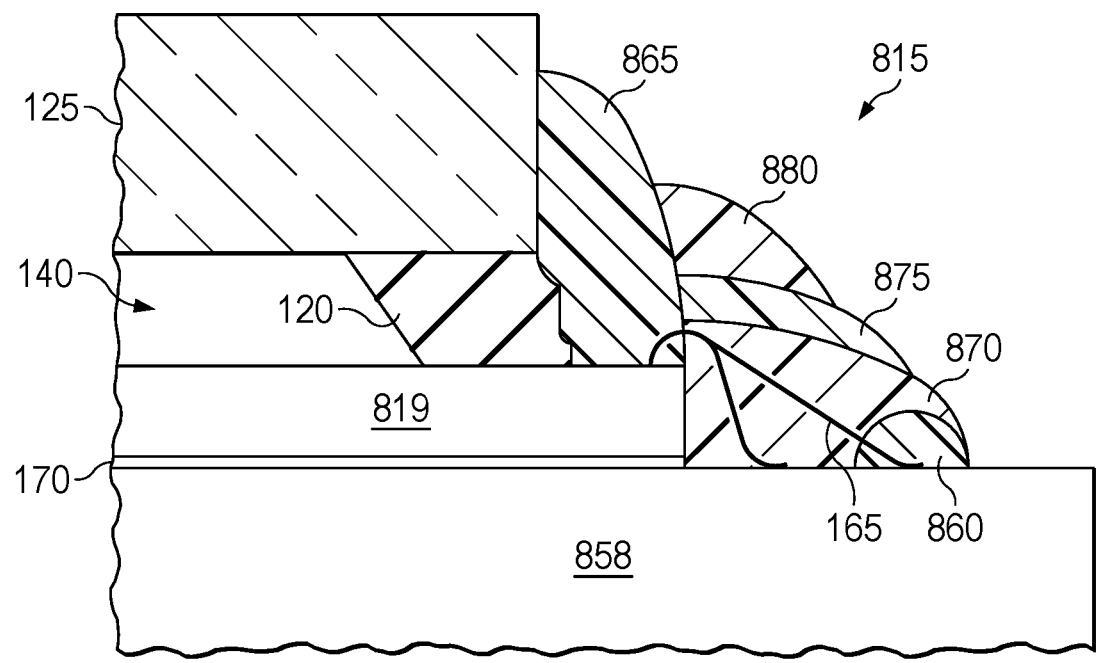

FIGS. 8A-8C are illustrative examples of a first example epoxy profile 805, a second example epoxy profile 810, and a third example epoxy profile 815 configured to include a plurality of peaks to manage stress. In the examples of FIGS. 8A-8C, the epoxy profiles 805-815 are illustrate alternative epoxy profiles, which may be constructed similarly to or with slight modifications of the two peak epoxy profile constructed using the plurality of layers 200 and 205 of FIGS. 2A-2C. Advantageously, a plurality of epoxy peaks increases control over dimensions of the epoxy profile.

FIG. 8A is an illustrative example of the first epoxy profile 805 configured to enclose the wire bonds 165. In the example of FIG. 8A, the illustrative example includes a first example silicon substrate 816 and a first example PCB 817. The first PCB 817 includes a channel 818. The channel 818 houses a portion of the first silicon substrate 816. The channel 818 reduces the complexity of mounting the first silicon substrate 816 to the first PCB 817. The channel 818 is configured similar to the second channel 335 of FIGS. 3C and 5. The channel 818 reduces stress applied to the silicon substrate 816 by the first PCB 817.

In the example of FIG. 8A, the first epoxy profile 805 includes a first epoxy layer 820, a second epoxy layer 825, a third epoxy layer 830, and a fourth epoxy layer 835, such that the first epoxy profile 805 is manufactured as a result of applying the epoxy layers 820-835. A manufacturing process of the first epoxy profile 805 may begin by applying the epoxy layers 820 and 825. Similarly, to the first plurality of layers 200, a manufacturer may partially or fully cure the epoxy layers 820 and 825 prior to applying the remaining epoxy layers. Manufacturers may place the epoxy layers 830 and 835 following the application of the epoxy layers 820 and 825. The first epoxy profile 805 is an example multi-peak epoxy profile, such that one or more of the epoxy layers 820-835 are configured to construct a peak. Advantageously, multi-peak epoxy profiles may be constructed to reduce stress place on one or more portions of a MEMS package. For example, the first epoxy profile 805 is configured to reduce stress on the glass panel 125 of FIGS. 1A-1C a result of peaks applying stress to portions of the package (e.g., the silicon substrate, the PCB, etc.).

FIG. 8B is an illustrative example of the second epoxy profile 810 configured to enclose the wire bonds 165. In the example of FIG. 8B, the illustrative example includes the first PCB 817 and a second example silicon substrate 819. The first PCB 817 includes the channel 818. The channel 818 houses the second silicon substrate 819. The channel 818 reduces the complexity of mounting the second silicon substrate 819 to the first PCB 817.

In the example of FIG. 8B, the second epoxy profile 810 includes a fifth epoxy layer 840, a sixth epoxy layer 845, a seventh epoxy layer 850, and an eighth epoxy layer 855, such that the second epoxy profile 810 is manufactured as a result of applying the epoxy layers 840-855. A manufacturing process of the second epoxy profile 810 may begin by applying the epoxy layers 840 and 845. Similar to the first plurality of layers 200 a manufacturer may partially or fully cure the epoxy layers 840 and 845 prior to applying the remaining epoxy layers. Manufacturers may place the epoxy layers 850 and 855 after applying the epoxy layers 840 and 845. The second epoxy profile 810 is an example multi-peak epoxy profile, such that one or more of the epoxy layers 840-855 are configured to construct a peak. Advantageously, multi-peak epoxy profiles may be constructed to reduce stress place on one or more portions of a semiconductor package. For example, the second epoxy profile 810 is configured to reduce stress on the glass panel 125 of FIGS. 1A-1C a result of peaks applying stress to portions of the package (e.g., the silicon substrate, the PCB, etc.).

The first epoxy profile 805 includes a peak for each of the layers 820-835. Unlike the two peak epoxy profile of FIGS. 1A-1E, 2A-2E, 3A-3C, 5, 6A, 6B, and 7B, the peaks constructed by each of the layers 820-835 may apply excessive stress to wire bonds. Similar to the first epoxy profile 805, the second epoxy profile 810 constructs a peak for each of the layers 840-855. Unlike the first epoxy profile 805, the second epoxy profile 810 applies layers 850 and 855 between the layers 840 and 845. Such an application of epoxy layers reduces stress applied to the wire bonds. However, the second epoxy profile 810 includes a PCB to include a channel of a depth greater than that of the thickness of the silicon substrate 816 to construct a stress reducing epoxy profile.

FIG. 8C is an illustrative example of the third epoxy profile 815 configured to enclose the wire bonds 165 and to couple the second silicon substrate 819 to a second example PCB 858. In the example of FIG. 8C, the third epoxy profile 815 includes a ninth epoxy layer 860, a tenth epoxy layer 865, an eleventh epoxy profile 870, a twelfth epoxy layer 875, and a thirteenth epoxy layer 880, such that the third epoxy profile 815 is manufactured after applying and curing the epoxy layers 860-880. A manufacturing process of the third epoxy profile 815 may begin by applying the epoxy layers 860 and 865. Alternatively, the ninth epoxy layer 860 may be constructed by applying a plurality of layers of epoxy. Similarly to the first plurality of layers 200, a manufacturer may partially or fully cure the epoxy layers 860 and 865 prior to applying the remaining epoxy layers. Manufacturers may place the layers of epoxy 870-880 after applying and at least partially curing the epoxy layers 860 and 865. The third epoxy profile 815 is an example multi-peak epoxy profile, such that one or more of the epoxy layers 860-880 are configured to construct a peak. Advantageously, multi-peak epoxy profiles may be constructed to reduce stress placed on one or more portions of a MEMS package. For example, the third epoxy profile 815 is configured to reduce stress on the glass panel 125 of FIGS. 1A-1C a result of peaks applying stress to other portions of the package (e.g., the silicon substrate, the PCB, etc.).

The third epoxy profile 815 includes a reduced number of peaks in comparison to the epoxy profiles 805 and 810. Similar to the two peak epoxy profiles of FIGS. 1A-1C, 2A-2C, 3A-3C, 5, 6A, 6B, and 7B, the third epoxy profile 815 includes a plurality of layers which are stacked on top of the ninth epoxy layer 860. However, the tenth epoxy layer 865 is coupled to a large portion of a side wall of the glass panel 125. Such an application of epoxy increases the likelihood of glass cracking during reliability testing as a result of a peak of the tenth epoxy layer 865 applying excessive stress on the glass panel 125.

Figure 9:
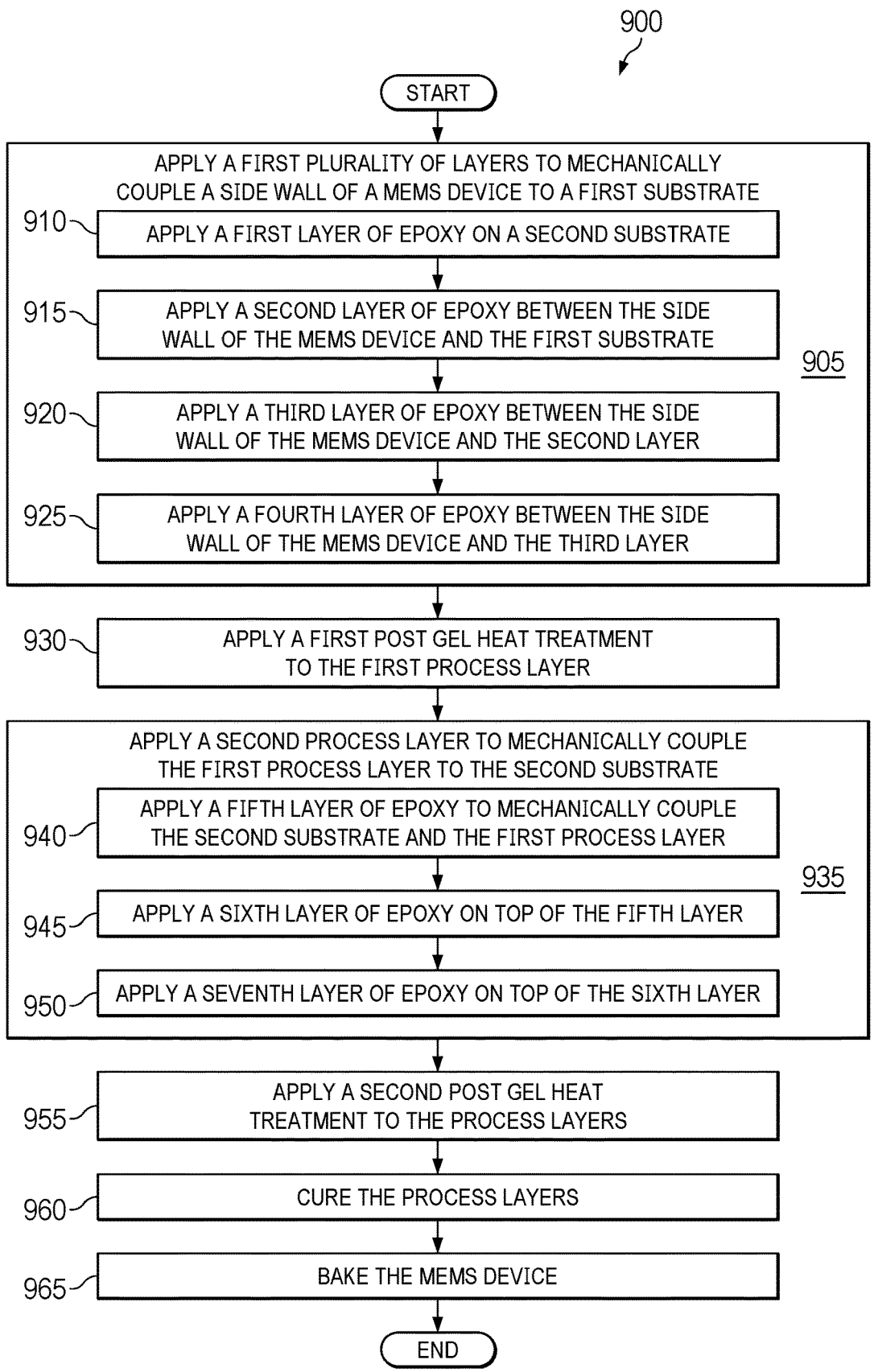
FIG. 9 is a flowchart representative of an example process to construct an example two peak epoxy profile using the process layers of FIGS. 2A-2C, and/or, more generally, to reduce stress applied by an epoxy coating on MEMS packages.

FIG. 9 is a flowchart representative of an example process 900 that may be performed to construct the two peak epoxy profile 175 of FIG. 1B-1E using the plurality of layers 200 and 205 of FIGS. 2A-2C, and/or, more generally, to reduce stress applied by an epoxy coating on a MEMS device. Although the process 900 is discussed in connection with the two peak epoxy profile 175, the process 900 may be modified in accordance with the teachings disclosed herein to construct epoxy profiles including a plurality of peaks. The process 900 begins at block 905. At block 905, a first plurality of layers are applied to a first substrate and a PCB to mechanically couple a side wall of a MEMS device adjacent to the first substrate. The first substrate being the silicon substrate 115 of FIGS. 1A-1E, 2A-2E, 3A-3C, and 4, 560 of FIG. 5, etc. The first plurality of layers may include applying epoxy to the PCB 110 of FIGS. 1A-1E and 2A-2E, 319 of 3A and 3B, 330 of 3B, etc. For example, the first peak 238 of FIG. 2C (e.g., the first peak 770 of FIGS. 7A and 7B) is constructed as a result of applying the first plurality of layers 200 to mechanically couple a side wall of the MEMS device 105 (the second surface 215 of FIG. 2A) to the silicon substrate 115 of the MEMS device 105. Block 905 includes blocks 910-925. The application of epoxy to construct the first peak 238, at block 905, begins at block 910.

At block 910, a first layer of epoxy is applied to a second substrate. The second substrate being a PCB. For example, the formation of first plurality of layers 200 begins by applying the first layer 220 to the PCB 110. In such an example, the first layer 220 is a layer of epoxy which is configured to enclose a plurality of terminals which are electrically coupled to the wire bonds 165, such that the wire bonds 165 are electrically coupled between the MEMS device 105 and the PCB 110. An epoxy dispenser (not illustrated) may be configured to apply epoxy to form the first layer based on a mass of an epoxy, a PCB, and/or a shape of an epoxy profile. For example, an epoxy dispenser, which is configured to apply epoxy in a line across all of the wire bonds 165, applies approximately two milligrams (mg) of a glob top epoxy to the PCB 110 to construct the first layer 220. Such an epoxy dispenser may be configured to apply the first epoxy layer as a line of epoxy and by dispensing pre-determined mass of epoxy. The mass of epoxy applied as the first layer 220 may be determined based on a shape of the PCB 110, a length of the wire bonds 165, and/or a thickness of the silicon substrate 115. For example, the first epoxy profile 610 of FIG. 6A requires more epoxy compared to the second epoxy profile 620 of FIG. 6B as a result of the gap 650 of FIGS. 6A and 6B being filled with the spacer 660 of FIG. 6B. In another example, the silicon substrate 750 of FIGS. 7A-7C of the thickness 760 of FIG. 7B may require layers comprising the first plurality of layers 200 to be thicker compared to the thickness of the silicon substrate 115 of FIGS. 1B, 1C, 2A, 2B, 3A, 3B, 4, 6A, and 6B. Although the first layer 220 is discussed in connection with the process 900, block 910 may be modified in accordance with the teachings described herein to construct the first layers 321 of FIG. 3B, 631 of FIG. 6A, 820 of FIG. 8A, 840 of FIG. 8B, and/or 860 of FIG. 8C. The application of epoxy to construct the first plurality of layers 200 proceeds to block 915 after applying the first layer 220.

At block 915, a second layer of epoxy is applied between the side wall of the MEMS device and the first substrate. For example, applying the second layer 225 of FIGS. 2A and 2B between the side wall (the second surface 215) of the MEMS device 105 and the silicon substrate 115. In such an example, the second layer 225 mechanically couples the silicon substrate 115 adjacent to portions of the second surface 215. The second layer 225 may be configured to enclose portions of the wire bonds 165 which are electrically coupled to the silicon substrate 115, such that a portion of the wire bonds 165 and/or a plurality of terminals (located on the first surface 210 of FIG. 2A) are enclosed by the second layer 225. The first plurality of layers 200 corresponds to the first peak 238 (e.g., the first peak 770 of FIGS. 7A and 7B) of a two peak epoxy profile, such that the second plurality of layers 205 corresponds to the second peak 255 of FIG. 2C (e.g., the second peak 780 of FIGS. 7A and 7B) of the two peak epoxy profile. Although the second layer 225 is discussed in connection with the process 900, block 915 may be modified in accordance with the teachings described herein to construct the layers 322 of FIG. 3B, 632 of FIG. 6A, 825 of FIG. 8A, 845 of FIG. 8B, and/or 865 of FIG. 8C. The application of epoxy to construct the first plurality of layers 200 proceeds to block 920.

At block 920, a third layer of epoxy is applied between the side wall of the MEMS device and the second layer, for example second layer 225. For example, applying the third layer 230 between the side wall (the second surface 215) of the MEMS device 105 and the second layer 225, applied at block 915. In such an example, the third layer 230 mechanically couples the second surface 215 adjacent to the second layer 225 to increase the area of the second surface 215 where stress may be applied. The third layer 230 covers at least a portion of the second layer 225, such that the layers 225 and 230 are stacked. Although the third layer 230 is discussed in connection with the process 900, block 920 may be modified or removed in accordance with the teachings described herein to construct the third layers 323 of FIG. 3B, 633 of FIG. 6A or to construct a portion of the layers 825 of FIG. 8A, 845 of FIG. 8B, and/or 865 of FIG. 8C. The application of epoxy to construct the first plurality of layers 200 proceeds to block 925 after applying the first layer 220.

At block 925, a fourth layer of epoxy is applied between the side wall of the MEMS device and the third layer, for example the third layer of block 920. For example, applying the fourth layer 235 between the side wall (the second surface 215) of the MEMS device 105 and the third layer 230, applied at block 920. More than four layers of epoxy or fewer than four layers of epoxy may be used in forming the first plurality of layers 200 based on the MEMS device 105, the PCB 110, the thickness of the substrate, etc. For example, the epoxy profiles 805-815 of FIGS. 8A-8C include blocks 910 and 915. Although the fourth layer 235 is discussed in connection with the process 900, block 925 may be modified or removed in accordance with the teachings described herein to construct the fourth layers 324 of FIG. 3B, 635 of FIG. 6A or to construct a portion of the layers 825 of FIG. 8A, 845 of FIG. 8B, and/or 865 of FIG. 8C. The fourth layer 235 mechanically couples the second surface 215 to the third layer 230 to further increase the surface area in contact with the first process layer, such that stress may be distributed across a greater area. The area of the second surface 215 in contact with the first plurality of layers 200 may be modified to increase or decrease the area mechanically coupled to epoxy comprising the layers 225-235.

Manufacturers may modify an amount of epoxy applied in the construction of the first plurality of layers 200 to modify application of stress. For example, a manufacturer may increase an amount of epoxy for the layers 225-235 to increase the height of the first peak 238 of the two peak epoxy profile 175 and increase the area in contact with the second surface 215, such that stress applied on the second surface 215 is applied over an increased area. An amount of epoxy applied in blocks 910-925 is determined based on the characteristics of the MEMS device 105 and the PCB 110. For example, the layers 220-235 are constructed using the epoxy dispenser to apply approximately two milligrams (mg) of epoxy. The process 900 proceeds to block 930 after applying epoxy to construct the first plurality of layers 200, at block 905.

At block 930, a first post gel heat treatment is applied to the first process layer. For example, the first plurality of layers 200 is partially or fully cured by applying a first post gel heat treatment to the first plurality of layers 200. The first post gel heat treatment is a process of applying heat, using a heat source, which causes the epoxy of the first plurality of layers 200 to form a defined shape (e.g., a peak). The first post gel heat treatment duration may be different based on the type of epoxy (e.g., glob top epoxy, etc.) and/or the amount of epoxy used for the layers applied in blocks 910-925. For example, a manufacturer may use a 110 degree Celsius (° C.) oven for approximately seven minutes to cure the first plurality of layers 200 when the amount of epoxy applied to each of the layers 220-235 is approximately equal to 2 milligrams (mg). The temperature of the post gel heat treatment may vary based on characteristics of the epoxy being applied, such that some epoxies may require a different temperature to cure. The process 900 proceeds to block 935 to construct the second peak 255 (e.g., the second peak 780).

At block 935, a second process layer is applied to mechanically couple the first process layer to the second substrate. For example, the second plurality of layers 205 is applied to mechanically couple the first plurality of layers 200 to the PCB 110 and to construct the second peak 255. Block 935 includes blocks 940-950. The application of epoxy to construct the second peak, at block 935, begins at block 940.

At block 940, a fifth layer of epoxy is applied to mechanically couple the second substrate and the first process layer. For example, the fifth layer 240 of FIG. 2B is applied to mechanically couple the PCB 110 to the first plurality of layers 200, for example to couple the fifth layer 240 to the PCB 110, the first layer 220, and the layers 225-235. The fifth layer 240 encloses at least a portion of the wire bonds 165. Similar to the layers 220-235, applied at blocks 910-925, the amount of epoxy applied at block 940 may be determined based on characteristics of MEMS package being produced. For example, the fifth layer 240 is constructed, by the epoxy dispenser, using approximately two and a half milligrams (mg) of the glob top epoxy. The fifth layer 240 may mechanically couple the PCB 110 and the silicon substrate 115, such that the fifth layer 240 may fill in gaps between the PCB 110 and the wire bonds 165. Although the fifth layer 240 is discussed in connection with the process 900, block 940 may be modified in accordance with the teachings described herein to construct the fifth layers 325 of FIG. 3B, 635 of FIG. 6A, or the layers 830 of FIG. 8A, 850 of FIG. 8B, and/or 870 of FIG. 8C. The application of epoxy to construct the second plurality of layers 205 proceeds to block 945.

At block 945, a sixth layer of epoxy is applied on top of the fifth layer of epoxy. For example, applying the sixth layer 245 of FIG. 2B on top of the fifth layer 240. In such an example, the sixth layer 245 mechanically couples the first plurality of layers 200 to the fifth layer 240 to increase the surface area of the first plurality of layers 200 where stress may be applied. The fifth layer distributes stress, caused by the second substrate, over a greater portion of the first plurality of layers of block 905. The sixth layer 245 may be constructed using a pre-determined amount of epoxy. For example, the sixth layer 245 is constructed, by the epoxy dispenser using approximately three milligrams (mg) of the glob top epoxy. The sixth layer 245 may be mechanically couple the first plurality of layers 200 to the PCB 110 to further reduce stress applied at any given portion of the first plurality of layers 205. Although the sixth layer 245 is discussed in connection with the process 900, block 945 may be modified in accordance with the teachings described herein to construct the sixth layers 326 of FIG. 3B, 636 of FIG. 6A, or at least a portion of the layers 835 of FIG. 8A, 855 of FIG. 8B, and/or 875 of FIG. 8C. The application of epoxy to construct the second plurality of layers 205 proceeds to block 950.

At block 950, a seventh layer of epoxy is applied on top of the sixth layer of epoxy. For example, the seventh layer 250 of FIGS. 2B and 2C is applied on top of the sixth layer 245. In such an example, the seventh layer 250 mechanically couples the first plurality of layers 200 to the sixth layer 245 to increase the surface area of the first plurality of layers 200 where stress may be applied. The seventh layer 250 may be constructed using a pre-determined amount of epoxy. For example, the seventh layer 250 is constructed, by the epoxy dispenser, using approximately six milligrams (mg) of the glob top epoxy. The seventh layer 250 may be mechanically coupled to the PCB 110 to further reduce stress applied at any given portion of the first plurality of layers 200 by the second plurality of layers 205. Although the seventh layer 250 is discussed in connection with the process 900, block 950 may be modified or removed in accordance with the teachings described herein to construct the seventh layers 327 of FIG. 3B, 638 of FIG. 6A or to construct at least a portion of the layers 835 of FIG. 8A, 855 of FIG. 8B, and/or 880 of FIG. 8C. In the example of process 900, the layers 240-250 construct the second plurality of layers 205 corresponding to the second peak of the two peak epoxy profile being constructed as a result of process 900. The process 900 proceeds to block 955. In the illustrated example, three layers of epoxy are applied in block 935. However, fewer or more layers of epoxy may be applied in block 935.

At block 955, a second post gel heat treatment is applied to the process layers. For example, epoxy layers are partially or fully curing by applying a second post gel heat treatment to the plurality of layers 200 and 205. The second post gel heat treatment is a process of applying heat, using a heat source, which causes the epoxy of the plurality of layers 200 and 205 to form a defined shape (e.g., two peaks). The second post gel heat treatment duration may be different based on the type of epoxy (e.g., free flow epoxy, glob top epoxy, etc.) and/or the amount of epoxy used for the layers 240-250. For example, a manufacturer may use a 110 degree Celsius (° C.) oven for approximately ten minutes to cure the second plurality of layers 205 when the amount of epoxy applied the fifth layer 240 is 2.5 milligrams (mg), the sixth layer 245 is 3 milligrams (mg), and the seventh layer 250 is 6 milligrams (mg). The temperature of the post gel heat treatment may vary based on characteristics of the epoxy being applied, such that some epoxies may require a different temperature to cure. The process 900 proceeds to block 960.

At block 960, the process layers are cured. For example, a heat source is used to cure the plurality of layers 200 and 205, such that the epoxy forming the two peaks 238 and 255 become solid structures. In such an example, epoxy applied at blocks 905-925 and 935-950 may be partially solidified, such that the two peaks 238 and 255 may be changed in response to applying pressure to the epoxy, prior to block 960. An example curing of the plurality of layers 200 and 205 prevents epoxy comprising the plurality of layers 200 and 205 from being modified. The curing process of block 960 is of a duration and temperature corresponding to characteristics of epoxy comprising the plurality of layers 200 and 205. For example, a glob top epoxy may be cured at 118 degrees Celsius (° C.) for two hours to fully set the shape of the plurality of layers 200 and 205. The process 900 proceeds to block 960.

At block 965, the MEMS device is baked. For example, baking the MEMS device at 153 degrees Celsius (° C.) for twelve hours fully cures and sets the epoxy comprising the two peak epoxy profile 175, such that the peaks are form a solid shape protecting the wire bonds 165. The process 900 proceeds to end.

Although example methods are described with reference to the flowchart illustrated in FIG. 9, many other methods of manufacturing a two peak epoxy profile may alternatively be used in accordance with the in accordance with this description. For example, the order of execution of the blocks may be changed, and/or some of the blocks described may be changed, eliminated, or combined. Similarly, additional operations may be included in the manufacturing process before, in between, or after the blocks shown in the illustrated examples.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Unless otherwise stated, "about," "approximately," or "substantially" preceding a value means +/−10 percent of the stated value.

Modifications are possible in the described embodiments, and other embodiments are possible, within the scope of the claims.

What is claimed is:

1. A method comprising:
    applying first non-conductive layers to a first substrate, at least a portion of the first non-conductive layers mechanically coupled to a second substrate;
    applying a first heat treatment to the first non-conductive layers;
    after applying the first heat treatment to the first non-conductive layers, applying second non-conductive layers to the second substrate and to the first non-conductive layers; and
    applying a second heat treatment to the first non-conductive layers and the second non-conductive layers.

2. The method of claim 1, further including curing the first non-conductive layers and the second non-conductive layers by applying a heat treatment to set a shape of the first non-conductive layers and the second non-conductive layers.

3. The method of claim 1, further including baking the first non-conductive layers and the second non-conductive layers for twelve hours.

4. The method of claim 1, wherein applying the first non-conductive layers further includes:
    applying a first layer of non-conductive material on the second substrate;
    applying a second layer of non-conductive material on the first substrate;
    applying a third layer of non-conductive material on the second layer; and
    applying a fourth layer of non-conductive material on the third layer.

5. The method of claim 4, wherein applying the second non-conductive layers further includes:
    applying a fifth layer of non-conductive material between the first layer and at least one of the second layer, the third layer, or the fourth layer;
    applying a sixth layer of non-conductive material on the fifth layer of non-conductive material; and
    applying a seventh layer of non-conductive material on the sixth layer of non-conductive material.

6. An apparatus comprising:
    a microelectromechanical system (MEMS) device having a first surface and a second surface;
    a substrate having a third surface;
    wire bonds electrically coupling the MEMS device and the substrate; and
    a non-conductive coating mechanically coupled to the wire bonds, the non-conductive coating including:

first non-conductive layers adjacent to the first surface and the second surface; and second non-conductive layers adjacent to the third surface and the first epoxy layers.

7. The apparatus of claim 6, wherein the non-conductive coating further includes a first peak and a second peak, the first peak constructed by applying the first non-conductive layers, the second peak constructed by applying the second non-conductive layers.

8. The apparatus of claim 6, wherein the substrate is a printed circuit board or a ceramic substrate.

9. The apparatus of claim 6, wherein the substrate has a channel housing the MEMS device.

10. The apparatus of claim 6, wherein the substrate has a channel housing a plurality of terminals coupled to the wire bonds.

11. The apparatus of claim 6, wherein the first non-conductive layers include a layer of glob top epoxy adjacent to the third surface.

12. The apparatus of claim 6, wherein the second non-conductive layers are adjacent to portions of the second surface.

13. The apparatus of claim 6, wherein the first non-conductive layers include a third non-conductive layer, and a fourth non-conductive layer, and the second non-conductive layers include a fifth non-conductive layer, a sixth non-conductive layer, and a seventh non-conductive layer, the first non-conductive layers each including two milligrams of non-conductive material, the fifth non-conductive layer including two and a half milligrams of non-conductive material, the sixth non-conductive layer including three milligrams of non-conductive material, and the seventh non-conductive layer including six milligrams of non-conductive material.

14. A system comprising:
a first substrate;
a second substrate;
wire bonds electrically coupling the first substrate and the second substrate;
a non-conductive coating mechanically coupled to the first substrate, to the second substrate, and to the wire bonds, the non-conductive coating including:
a first peak adjacent to the first substrate; and
a second peak adjacent to the second substrate, the second peak over the wire bonds.

15. The system of claim 14, wherein the non-conductive coating further includes first non-conductive layers and second non-conductive layers, the first peak constructed by applying the first non-conductive layers, the second peak constructed by applying the second non-conductive layers.

16. The system of claim 14, wherein the second substrate is a printed circuit board or a ceramic substrate.

17. The system of claim 14, wherein the second substrate includes a channel housing the first substrate.

18. The system of claim 14, wherein the non-conductive coating is configured to enclose the wire bonds using a glob top epoxy.

19. The system of claim 14, wherein the second substrate has a channel housing a plurality of terminals coupled to the wire bonds.

20. The system of claim 14, wherein the first peak includes a first non-conductive layer, a second non-conductive layer, and a third non-conductive layer, and the second peak includes a fourth non-conductive layer, a fifth non-conductive layer, a sixth non-conductive layer, and seventh non-conductive layer, the first non-conductive layers each including two milligrams of epoxy, the fourth non-conductive layer including two milligrams of non-conductive material, the fifth non-conductive layer including two and a half milligrams of non-conductive material, the sixth non-conductive layer including three milligrams of epoxy, and the seventh non-conductive layer including six milligrams of epoxy.

\* \* \* \* \*